United States Patent
Sotoyama et al.

(10) Patent No.: US 9,412,964 B2
(45) Date of Patent: Aug. 9, 2016

(54) ORGANIC ELECTROLUMINESCENT ELEMENT

(71) Applicant: UDC Ireland Limited, Dublin (IE)

(72) Inventors: Wataru Sotoyama, Kanagawa (JP); Daisuke Inoue, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 323 days.

(21) Appl. No.: 13/914,540

(22) Filed: Jun. 10, 2013

(65) Prior Publication Data

US 2013/0328027 A1    Dec. 12, 2013

(30) Foreign Application Priority Data

Jun. 12, 2012  (JP) ................. 2012-133078

(51) Int. Cl.
*H01L 51/50* (2006.01)
*H01L 51/00* (2006.01)

(52) U.S. Cl.
CPC ........ *H01L 51/5092* (2013.01); *H01L 51/5004* (2013.01); *H01L 51/5064* (2013.01); *H01L 51/006* (2013.01); *H01L 51/0058* (2013.01); *H01L 51/0081* (2013.01); *H01L 51/0085* (2013.01); *H01L 51/5088* (2013.01)

(58) Field of Classification Search
None
See application file for complete search history.

(56) References Cited

U.S. PATENT DOCUMENTS

| | | |
|---|---|---|
| 2005/0142384 A1 | 6/2005 | Itai |
| 2006/0119262 A1* | 6/2006 | Ikeda et al. .................. 313/506 |
| 2011/0215309 A1 | 9/2011 | D'Andrade et al. |
| 2011/0297925 A1* | 12/2011 | Breuning ....................... 257/40 |

FOREIGN PATENT DOCUMENTS

| | | |
|---|---|---|
| JP | 2000030868 | 1/2000 |
| JP | 2012-5024851 | 1/2012 |
| WO | 2004/912622 | 10/2004 |
| WO | 2011/049953 | 4/2011 |

* cited by examiner

*Primary Examiner* — Gregory Clark
(74) *Attorney, Agent, or Firm* — Riverside Law LLP

(57) ABSTRACT

[It is an object] to provide an organic electroluminescent element with which the initial durability of the element can be greatly improved while maintaining the efficiency of the element at a high level. This is an organic electroluminescent element having an anode, a hole injection layer, a first hole transport layer, a second hole transport layer, a light-emitting layer, and a cathode, in this order, with this organic electroluminescent element being such that the aforementioned hole injection layer includes a material for which the energy of the lowest unoccupied molecular orbital (LUMO) is less than −4.0 eV and also such that the energy E1(LUMO) of the LUMO of the material included in the aforementioned first hole transport layer and the energy E2(LUMO) of the LUMO of the material included in the aforementioned second hole transport layer satisfy [the inequality] E1(LUMO)>E2(LUMO).

14 Claims, 1 Drawing Sheet

ORGANIC ELECTROLUMINESCENT ELEMENT

CROSS-REFERENCE TO RELATED APPLICATIONS

The present U.S. patent application claims priority benefit from Japanese Patent Appl. No. 2012-133078, filed 12 Jun. 2012, which is incorporated by reference herein in its entirety.

TECHNICAL FIELD

The present invention relates to an organic electroluminescent element (hereinafter also referred to as an organic EL element).

BACKGROUND ART

Organic electroluminescent elements have advantages such as self-emission and high-speed response and are expected to find application in flat panel displays. In particular, ever since a report about a two-layer type (laminated type) in which a hole transporting organic thin film (hole transport layer) and an electron transporting organic thin film (electron transport layer) are laminated, [this type] has been of increasing interest as a large surface area light-emitting element that emits light at a low voltage of 10 V or less. A laminated-type organic electroluminescent element has a basic structure comprising a positive electrode, a hole transport layer, a light-emitting layer, an electron transport layer, and a negative electrode.

Organic electroluminescent elements such as this have been the subject of various investigations because they afford high luminous efficiency.

For example, with an organic electroluminescent element including an electron transport layer, a hole transport layer, an anode, and a cathode, an element has been proposed which further includes (a) a hole blocking layer that is disposed between the cathode and the electron transport layer and that has a greater ionization potential than the ionization potential of the electron transport layer and/or (b) an electron blocking layer that is disposed between the anode and the hole transport layer and that has less electron affinity than the electron affinity of the hole transport layer (Patent Document 1). There have been attempts at using this element configuration to increase the reverse bias characteristics of the element and to improve the brightness and luminous efficiency.

RELATED ART DOCUMENTS

Patent Documents

Patent Document 1: Japanese Laid-Open Patent Application 2000-030868

SUMMARY OF THE INVENTION

Problems to be Solved by the Invention

However, investigation by the inventors has revealed that the initial durability of the element is low with the organic electroluminescent element described in Patent Document 1.

When an organic electroluminescent element is used in a display, in particular, burn-in occurs if the initial durability of the element is low, so from the standpoint of the practical application of the element as well, increasing the initial durability remained a problem. Burn-in means that degradation of some of pixels in the display causes a drop-off in brightness, so these pixels become darker than the surrounding pixels. The brightness of pixels becomes noticeable by the user when it drops off by only a few percent from that of the surrounding pixels, so the durability at the initial drive of the organic EL element is an important performance index.

It is an object of the present invention to solve the aforementioned problem encountered in the past and to achieve the following object: Specifically, it is an object to provide an organic electroluminescent element with which initial durability can be greatly increased without sacrificing the other characteristics of a conventional organic electroluminescent element.

Means for Solving the Problems

Investigation by the inventors has revealed that the aforementioned problem can be solved by using an organic electroluminescent element having an anode, a hole injection layer, a first hole transport layer, a second hole transport layer, a light-emitting layer, and a cathode, in this order, with this organic electroluminescent element being such that the aforementioned hole injection layer includes a material for which the energy of the lowest unoccupied molecular orbital (LUMO) is less than −4.0 eV and also such that the energy $E1(LUMO)$ of the LUMO of the material included in the aforementioned first hole transport layer and the energy $E2(LUMO)$ of the LUMO of the material included in the aforementioned second hole transport layer satisfy [the inequality] $E1(LUMO) > E2(LUMO)$.

Specifically, the present invention can be accomplished by the following means: Note that in this Specification, [the phrase] "x to y" indicates a range that includes the numerical values given for "x" and "y" as the minimum and maximum values, respectively.

(1)

An organic electroluminescent element having an anode, a hole injection layer, a first hole transport layer, a second hole transport layer, a light-emitting layer, and a cathode, in this order, wherein the hole injection layer includes a material for which the energy of the lowest unoccupied molecular orbital (LUMO) is less than −4.0 eV, and also the energy $E1(LUMO)$ of the LUMO of the material included in the first hole transport layer and the energy $E2(LUMO)$ of the LUMO of the material included in the second hole transport layer satisfy [the inequality] $E1(LUMO) > E2(LUMO)$.

(2)

The organic electroluminescent element according to (1), wherein the first hole transport layer includes at least one type of material expressed by any of General Formulas 1 to 3[1] below.

[1] Translator's note: In the Japanese original document, the labeling number for each of the general formulas is indicated in parentheses, but we have omitted the parentheses in the translation to avoid nested parentheses and confusion with other parenthetical notations.

$$M \quad \text{General Formula 1}$$

$$M-(X-M)_n-X-M \quad \text{General Formula 2}$$

-continued

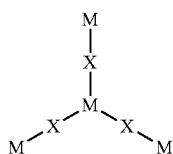

General Formula 3

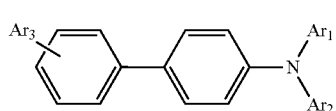

General Formula 4

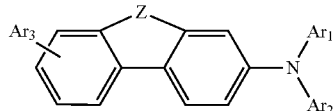

General Formula 5

In General Formulas 1 to 3, M represents the following structure: If M is bonded to X, then M represents a structure in which hydrogen atoms have been removed from the benzene ring of the following structure in a number corresponding to the number of bonded X [groups]:

M:

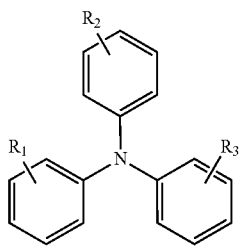

($R_1$, $R_2$, and $R_3$ represent each independently an alkyl group, a cycloalkyl group, a silyl group, an alkoxy group, an aryloxy group, an alkylthio group, or an arylthio group. $R_1$, $R_2$, and $R_3$ may each bond together to form a ring.)

The X [groups] represent each independently one of the following structures:

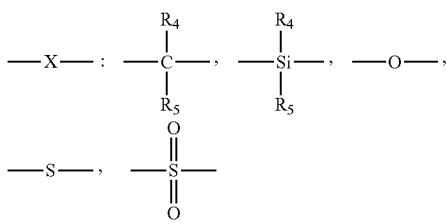

($R_4$ and $R_5$ represent each independently an alkyl group, a cycloalkyl group, a silyl group, an alkoxy group, an aryloxy group, an alkylthio group, or an arylthio group. $R_4$ and $R_5$ may bond together to form a ring.)

n represents an integer greater than or equal to 0.

(3)

The organic electroluminescent element according to (1) or (2), wherein the energy E1(LUMO) of the LUMO of the material included in the first hole transport layer and the energy E2(LUMO) of the LUMO of the material included in the second hole transport layer satisfy [the inequality] E1(LUMO)>E2(LUMO)+0.3 eV.

(4)

The organic electroluminescent element according to any one of (1) to (3), wherein the second hole transport layer includes at least one type of material expressed by either of General Formulas 4 and 5 below.

In General Formulas 4 and 5 above, $Ar_1$ and $Ar_2$ represent each independently an aryl group. The aryl group of $Ar_1$ and $Ar_2$ may be substituted with an alkyl group, an aryl group, or an amino group.

$Ar_3$ represents an amino group substituted with an alkyl group or an aryl group. The aryl group substituted on the amino group of $Ar_3$ may be further substituted with an alkyl group, an aryl group, or an amino group, and the alkyl group or aryl group substituted on the amino group of $Ar_3$ may form a ring by bonding to another alkyl group or aryl group substituted on the amino group of $Ar_3$.

Z represents one of the following structures:

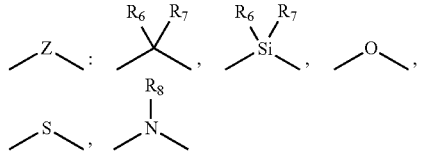

($R_6$ to $R_8$ represent each independently an alkyl group or an aryl group. The aryl group of $R_6$ to $R_8$ may be substituted with an alkyl group, an aryl group, or an amino group.)

(5)

The organic electroluminescent element according to any one of (1) to (4), wherein the material which is included in the hole injection layer and for which the energy of the LUMO is less than −4.0 eV is a material expressed by General Formula A below.

Rpi-(-CN)$_j$    General Formula A

Here, Rpi indicates an organic group including four or more π electrons, and j indicates an integer from 1 to 8.

(6)

The organic electroluminescent element according to any one of (1) to (5), wherein the thickness of the first hole transport layer is 3 to 30 nm.

(7)

The organic electroluminescent element according to any one of (1) to (6), wherein the thickness of the second hole transport layer is 3 to 30 nm.

(8)

The organic electroluminescent element according to any one of (1) to (7), further comprising an electron transport layer between the light-emitting layer and the aforementioned cathode.

(9)

The organic electroluminescent element according to any one of (1) to (8), wherein the light-emitting layer contains a light-emitting dopant and a host material, and the light-emitting dopant is a phosphorescent material.

(10)

The organic electroluminescent element according to (9), wherein the phosphorescent material is an iridium complex.

(11)

A light-emitting device featuring the organic electroluminescent element according to any one of (1) to (10).

(12)

A display device featuring the organic electroluminescent element according to any one of (1) to (10).

(13)

A lighting device featuring the organic electroluminescent element according to any one of (1) to (10).

Effects of the Invention

With the present invention, it is possible to provide an organic electroluminescent element with which the initial durability of the element can be greatly improved while the efficiency of the element is maintained at a high level.

DETAILED DESCRIPTION OF EMBODIMENTS

<Organic Electroluminescent Element>

The organic electroluminescent element of the present invention will be described in detail.

The organic electroluminescent element of the present invention is an organic electroluminescent element having an anode, a hole injection layer, a first hole transport layer, a second hole transport layer, a light-emitting layer, and a cathode, in this order, with this organic electroluminescent element being such that the aforementioned hole injection layer includes a material for which the energy of the lowest unoccupied molecular orbital (LUMO) is less than −4.0 eV and such that the energy E1(LUMO) of the LUMO of the material included in the aforementioned first hole transport layer and the energy E2(LUMO) of the LUMO of the material included in the aforementioned second hole transport layer satisfy [the inequality] E1(LUMO)>E2(LUMO).

In this Specification, the values for the highest occupied molecular orbital (HOMO) and the lowest unoccupied molecular orbital (LUMO) are calculation values obtained by performing structural optimization calculation using density functional theory (B3LYP/6–31G(d)) and then converting the resulting values into electron-volt units (eV).

From the standpoint of light-emitting element properties, the aforementioned organic electroluminescent element is preferably such that at least one of the pair of electrodes (anode and cathode) is transparent or semitransparent.

The aforementioned organic electroluminescent element may have a blocking layer (hole blocking layer, etc.), an electron transport layer, or the like in addition to the anode, cathode, light-emitting layer, hole injection layer, first hole transport layer, and second hole transport layer. A plurality of each of these layers may be provided, and if a plurality of layers are provided, they may be formed from the same material, or each layer may be formed from a different material.

Figure 1:
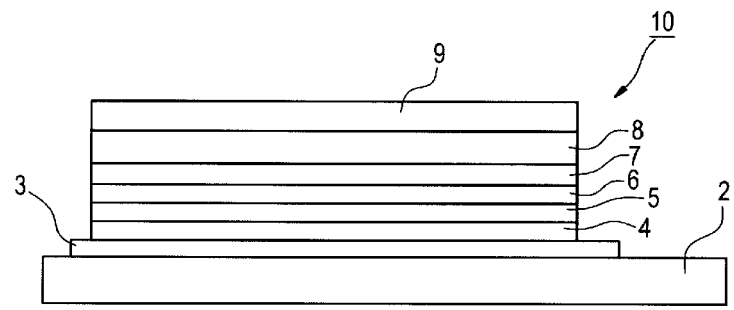
FIG. 1 is a schematic diagram showing one example of the configuration of the organic electroluminescent element according to the present invention.

FIG. 1 shows one example of the configuration of the organic electroluminescent element according to the present invention. The organic electroluminescent element 10 in FIG. 1 has organic layers including a light-emitting layer 7 between a pair of electrodes (an anode 3 and a cathode 9) on a substrate 2. Starting from the side of the anode 3, a hole injection layer 4, a first hole transport layer 5, a second hole transport layer 6, the light-emitting layer 7, and an electron transport layer 8 are laminated in this order as organic layers.

The following are concrete examples of the layer configuration, but the present invention is not limited to these.

anode/hole injection layer/first hole transport layer/second hole transport layer/light-emitting layer/electron transport layer/cathode anode/hole injection layer/first hole transport layer/second hole transport layer/light-emitting layer/blocking layer/electron transport layer/cathode anode/hole injection layer/first hole transport layer/second hole transport layer/light-emitting layer/blocking layer/electron transport layer/electron injection layer/cathode anode/hole injection layer/first hole transport layer/second hole transport layer/light-emitting layer/electron transport layer/electron injection layer/cathode The element configuration, substrate, cathode, and anode of the organic electroluminescent element are described in detail in Japanese Laid-Open Patent Application 2008-270736, for example, and what is described in this publication can be applied to the present invention.

<Substrate>

The substrate used in the present invention is preferably one that will not scatter or attenuate light emitted from the organic layers. In the case of an organic material, one with excellent heat resistance, dimensional stability, solvent resistance, electrical insulation properties, and workability is preferable.

<Anode>

In general, there are no particular restrictions on the shape, structure, size, and so forth of the anode as long as it functions as an electrode that supplies holes to the organic layers, and one can be suitably selected from publicly known electrode materials depending on the purpose and application of the light-emitting element. As was discussed above, the anode is usually provided as a transparent anode.

<Cathode>

In general, there are no particular restrictions on the shape, structure, size, and so forth of the cathode as long as it functions as an electrode that injects electrons into the organic layers, and one can be suitably selected from publicly known electrode materials depending on the purpose and application of the light-emitting element.

<Organic Layers>

The organic layers in the present invention will now be described.

(Formation of Organic Layers)

The various organic layers in the organic electroluminescent element of the present invention can be favorably formed by a dry film formation method such as vapor deposition or by a solution coating method such as bar coating, spin coating, printing, or transfer.

(Hole Injection Layer)

In the organic electroluminescent element of the present invention, the hole injection layer is formed by containing a material in which the energy of the LUMO is less than −4.0 eV. The energy of the LUMO of the material included in the hole injection layer is preferably at least −6.0 eV and less than −4.0 eV, more preferably at least −5.6 eV and less than −4.2 eV, and even more preferably at least −5.4 eV and less than −4.4 eV.

It is not clear why the initial durability of the element is greatly increased if the hole injection layer includes a material in which the energy of the LUMO is less than −4.0 eV. [However,] the aforementioned reason is surmised to be that the initial durability of the element is greatly improved because electrons that have leaked from the light-emitting layer can be prevented from reaching the interface between the hole injection layer and the hole transport layer (first hole transport layer).

In cases where a material in which the energy of the LUMO is less than −4.0 eV is not included in the hole injection layer, or in cases where the organic electroluminescent element does not have a hole injection layer, no increase in initial durability will be seen, which is not desirable.

There are no particular restrictions on the material which is included in the hole injection layer and in which the energy of the LUMO is less than −4.0 eV. From the standpoint of the stability of the material, the material which is included in the hole injection layer and in which the energy of the LUMO is less than −4.0 eV is preferably a material expressed by General Formula A below.

$$\text{Rpi}\text{-}(\text{CN})_j \qquad \text{General Formula A}$$

In General Formula A, Rpi indicates an organic group including four or more π electrons, and j indicates an integer from 1 to 8.

The following materials are examples of preferred modes for the material expressed by General Formula A above.

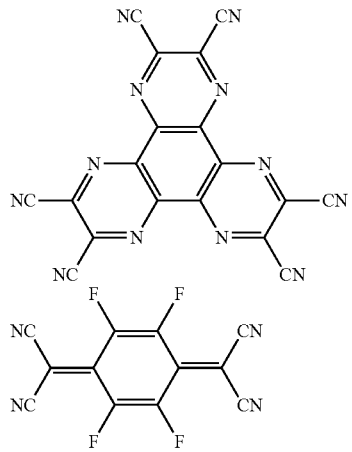

The hole injection layer need only include at least one type of the aforementioned material in which the energy of the LUMO is less than −4.0 eV, but may include a mixture of two or more types of material in which the energy of the LUMO is less than −4.0 eV. Furthermore, the hole injection layer may include a mixture of at least one type of the aforementioned material in which the energy of the LUMO is less than −4.0 eV and a material in which the energy of the LUMO is at least −4.0 eV.

If the hole injection layer includes a mixture of at least one type of the aforementioned material in which the energy of the LUMO is less than −4.0 eV and a material in which the energy of the LUMO is at least −4.0 eV, it is preferable for the material in which the energy of the LUMO is less than −4.0 eV to be contained in an amount of at least 0.05% and no more than 50%, more preferably at least 0.1% and no more than 20%, and even more preferably at least 0.2% and no more than 10%.

There are no particular restrictions on the material in which the energy of the LUMO is at least −4.0 eV and which can be included in the hole injection layer along with the aforementioned material in which the energy of the LUMO is less than −4.0 eV and which is included in the hole injection layer, but the following materials, for example, can be used favorably:

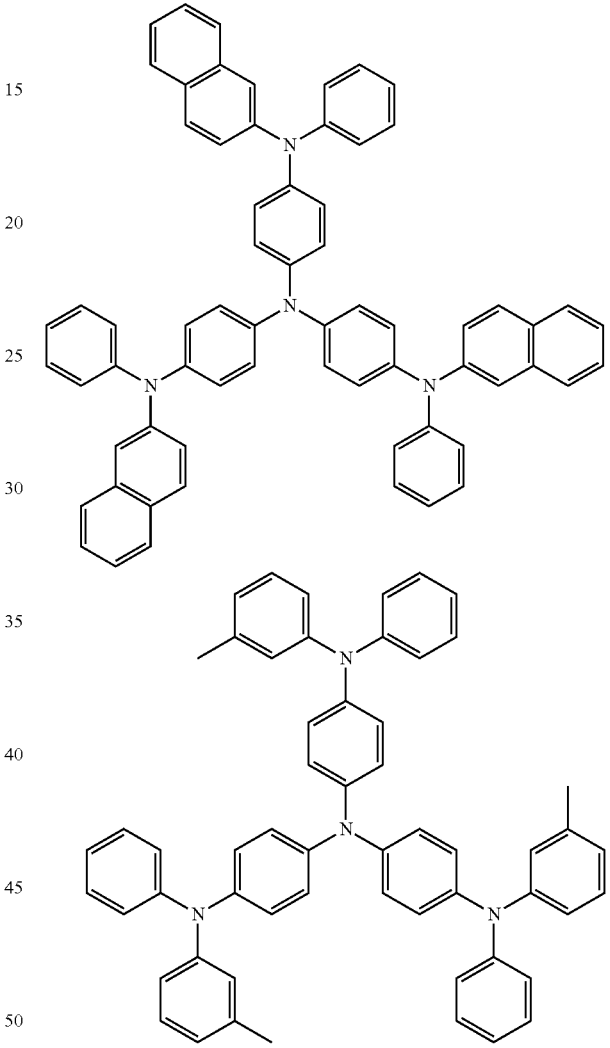

From the standpoint of drive voltage, the thickness of the hole injection layer is preferably at least 1 nm and no more than 200 nm, more preferably at least 2 nm and no more than 150 nm, and even more preferably at least 3 nm and no more than 130 nm.

(Hole Transport Layer)

In the organic electroluminescent element of the present invention, the hole transport layer is divided into a first hole transport layer and a second hole transport layer, and the energy E1(LUMO) of the LUMO of the material included in the first hole transport layer and the energy E2(LUMO) of the LUMO of the material included in the second hole transport layer satisfy [the inequality] E1(LUMO)>E2(LUMO).

Moreover, if the first hole transport layer or the second hole transport layer includes two or more types of material, then it is only necessary that the energy of the LUMO of the one or more types of material included in the first hole transport layer and the energy of the LUMO of the one or more types of material included in the second hole transport layer satisfy [the inequality] E1(LUMO)>E2(LUMO).

It is not clear why the initial durability of the element is greatly increased when the energy E1(LUMO) of the LUMO [of the material included] in the first hole transport layer and the energy E2(LUMO) of the LUMO [of the material included] in the second hole transport layer satisfy the aforementioned relationship. [However,] the aforementioned reason for the improved durability is surmised to be that a difference in the LUMO energy occurs between the first hole transport layer and the second hole transport layer, electrons that have leaked from the light-emitting layer are blocked, and fewer electrons reach the interface between the hole injection layer and the hole transport layer.

In addition, from the standpoint of blocking electrons that have leaked from the light-emitting layer at the interface between the first hole transport layer and the second hole transport layer, it is more preferable if the energy E1(LUMO) of the LUMO of the material included in the first hole transport layer and the energy E2(LUMO) of the LUMO of the material included in the second hole transport layer satisfy [the inequality] E1(LUMO)>E2(LUMO)+0.3 eV.

If the first hole transport layer or the second hole transport layer includes two or more types of material, then it is only necessary that the energy of the LUMO of the one or more types of material included in the first hole transport layer and the energy of the LUMO of the one or more types of material included in the second hole transport layer satisfy [the inequality] E1(LUMO)>E2(LUMO)+0.3 eV.

It is more preferable if the energy E1(LUMO) of the LUMO of the material included in the first hole transport layer and the energy E2(LUMO) of the LUMO of the material included in the second hole transport layer satisfy [the inequality] E1(LUMO)>E2(LUMO)+0.4 eV, and satisfying [the inequality] E1(LUMO)>E2(LUMO)+0.5 eV is even more preferable.

—First Hole Transport Layer—

There are no particular restrictions on the material included in the first hole transport layer as long as the energy E1(LUMO) of the LUMO of the material included in the first hole transport layer and the energy E2(LUMO) of the LUMO of the material included in the second hole transport layer satisfy the aforementioned relationship.

The first hole transport layer can include two or more types of material, but is preferably made up of just one type of material.

From the standpoint of improving the initial durability of the element, the first hole transport layer preferably includes at least one type of material expressed by any of General Formulas 1 to 3 below. Furthermore, it is more preferable if the first hole transport layer is made up of just one type of material expressed by any of General Formulas 1 to 3 below.

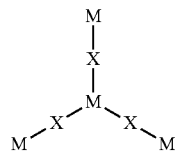

General Formula 1

General Formula 2

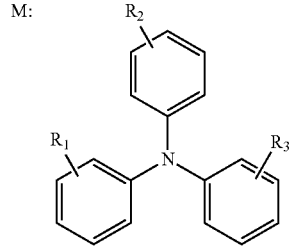

General Formula 3

In General Formulas 1 to 3, M represents the following structure: If M is bonded to X, then M represents a structure in which hydrogen atoms have been removed from the benzene ring of the following structure in a number corresponding to the number of bonded X [groups]:

M:

$R_1$, $R_2$, and $R_3$ represent each independently an alkyl group, a cycloalkyl group, a silyl group, an alkoxy group, an aryloxy group, an alkylthio group, or an arylthio group. $R_1$, $R_2$, and $R_3$ may each bond together to form a ring.

The alkyl group expressed by $R_1$, $R_2$, and $R_3$ is a straight-chain or branched alkyl group, preferably a $C_1$ to $C_{18}$ alkyl group, more preferably a $C_1$ to $C_{12}$ alkyl group, and even more preferably a $C_1$ to $C_6$ alkyl group. The alkyl group expressed by $R_1$, $R_2$, and $R_3$ is particularly preferably a methyl group, an ethyl group, an n-propyl group, an i-propyl group, an n-butyl group, a t-butyl group, an i-butyl group, an n-pentyl group, a neopentyl group, a t-amyl group, an s-isoamyl group, or an n-hexyl group, and most preferably a methyl group or a t-butyl group.

The cycloalkyl group expressed by $R_1$, $R_2$, and $R_3$ is preferably a $C_5$ to $C_{20}$ cycloalkyl group, more preferably a $C_5$ to $C_{12}$ cycloalkyl group, and even more preferably a $C_5$ to $C_{10}$ cycloalkyl group. The cycloalkyl group expressed by $R_1$, $R_2$, and $R_3$ is particularly preferably a cyclopentyl group, a cyclohexyl group, a cyclooctyl group, or an adamantyl group, and most preferably an adamantyl group.

The silyl group expressed by $R_1$, $R_2$, and $R_3$ is preferably a $C_3$ to $C_{40}$ trialkylsilyl group, tricycloalkylsilyl group, or triarylsilyl group, more preferably a $C_3$ to $C_{30}$ trialkylsilyl group, tricycloalkylsilyl group, or triarylsilyl group, and even more preferably a $C_3$ to $C_{24}$ trialkylsilyl group, tricycloalkylsilyl group, or triarylsilyl group. The silyl group expressed by $R_1$, $R_2$, and $R_3$ is particularly preferably a trimethylsilyl group, a triethylsilyl group, a triisopropylsilyl group, a tricyclohexylsilyl group, or a triphenylsilyl group, and most preferably a triisopropylsilyl group.

The alkoxy group expressed by $R_1$, $R_2$, and $R_3$ is preferably a $C_1$ to $C_{18}$ alkoxy group, more preferably a $C_1$ to $C_{12}$ alkoxy group, and even more preferably a $C_1$ to $C_6$ alkoxy group. The alkoxy group expressed by $R_1$, $R_2$, and $R_3$ is particularly preferably a methoxy group, an ethoxy group, an n-propoxy group, an i-propoxy group, an n-butoxy group, a t-butoxy group, or an i-butoxy group, and most preferably a methoxy group or a t-butoxy group.

The aryloxy group expressed by $R_1$, $R_2$, and $R_3$ is preferably a $C_6$ to $C_{30}$ aryloxy group, more preferably a $C_6$ to $C_{20}$ aryloxy group, and particularly preferably a $C_6$ to $C_{12}$ aryloxy group. The aryloxy group expressed by $R_1$, $R_2$, and $R_3$ is particularly preferably a phenyloxy group, a biphenyloxy group, or a terphenyloxy group, and most preferably a phenyloxy group.

The alkylthio group expressed by $R_1$, $R_2$, and $R_3$ is preferably a $C_1$ to $C_{18}$ alkylthio group, more preferably a $C_1$ to $C_{12}$ alkylthio group, and even more preferably a $C_1$ to $C_6$ alkylthio group. The alkylthio group expressed by $R_1$, $R_2$, and $R_3$ is particularly preferably a methylthio group, an ethylthio group, an n-propylthio group, an i-propylthio group, an n-butylthio group, a t-butylthio group, an i-butylthio group, an n-pentylthio group, a neopentylthio group, or an n-hexylthio group, and most preferably a methylthio group or a t-butylthio group.

The arylthio group expressed by $R_1$, $R_2$, and $R_3$ is preferably a $C_6$ to $C_{30}$ arylthio group, more preferably a $C_6$ to $C_{20}$ arylthio group, and particularly preferably a $C_6$ to $C_{12}$ arylthio group. The arylthio group expressed by $R_1$, $R_2$, and $R_3$ is particularly preferably a phenylthio group, a biphenylthio group, or a terphenylthio group, and most preferably a phenylthio group.

The X [groups] represent each independently one of the following structures:

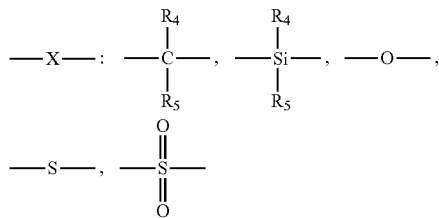

$R_4$ and $R_5$ represent each independently an alkyl group, a cycloalkyl group, a silyl group, an alkoxy group, an aryloxy group, an alkylthio group, or an arylthio group. $R_4$ and $R_5$ may bond together to form a ring.

The preferable ranges for the alkyl group, cycloalkyl group, silyl group, alkoxy group, aryloxy group, alkylthio group, and arylthio group expressed by $R_4$ and $R_5$ are the same as the preferable ranges for the alkyl group, cycloalkyl group, silyl group, alkoxy group, aryloxy group, alkylthio group, and arylthio group expressed by $R_1$, $R_2$, and $R_3$.

The X [groups] are preferably one of the following structures:

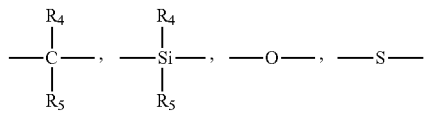

The X [groups] are more preferably one of the following structures:

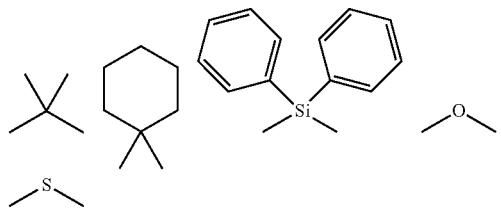

n represents an integer greater than or equal to 0.

n is preferably at least 0 and no more than 4, more preferably at least 0 and no more than 3, and even more preferably at least 0 and no more than 2.

The following materials are examples of preferred modes of the material expressed by General Formulas 1 to 3 above:

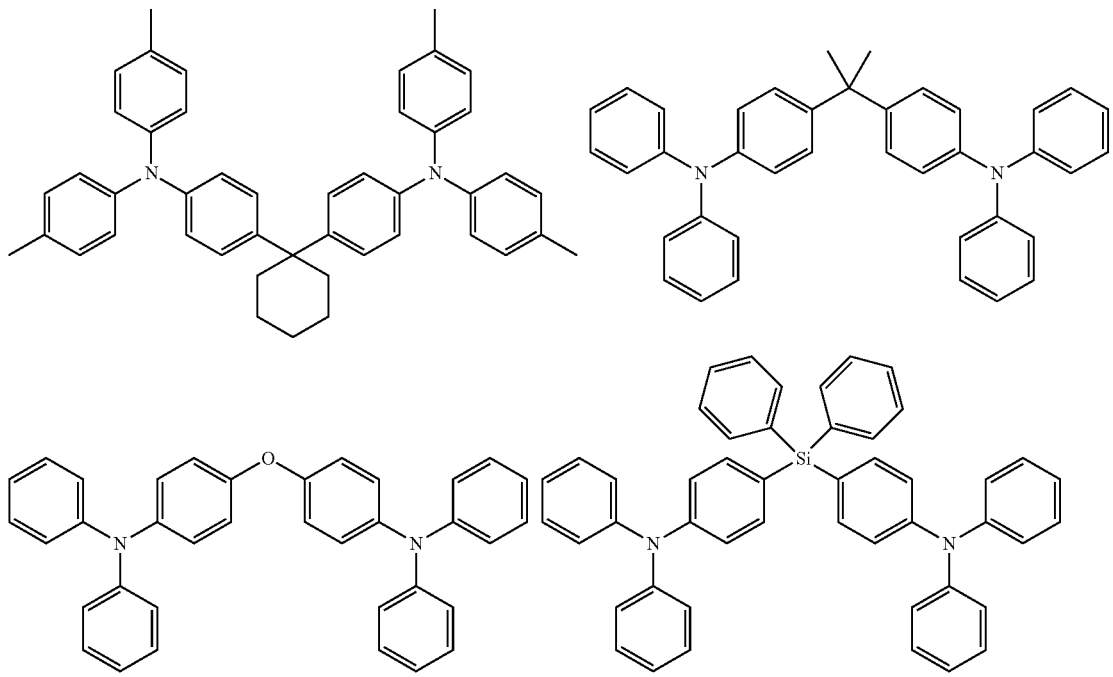

-continued
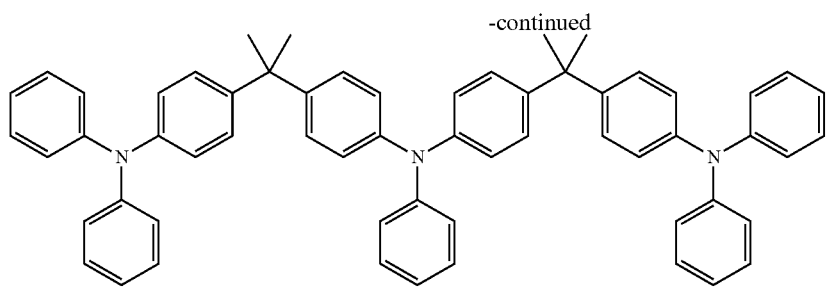
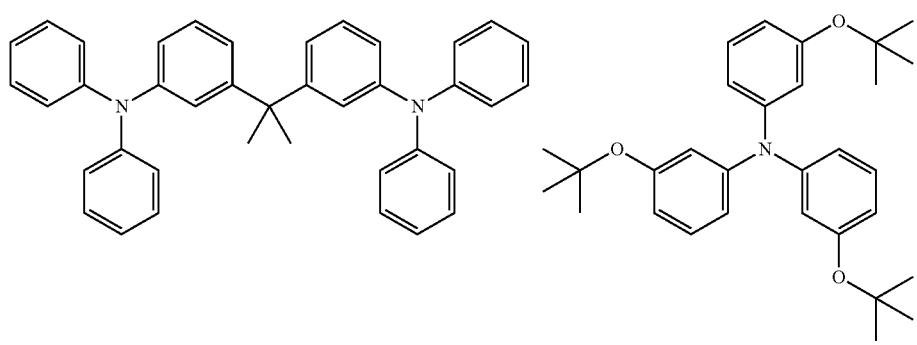
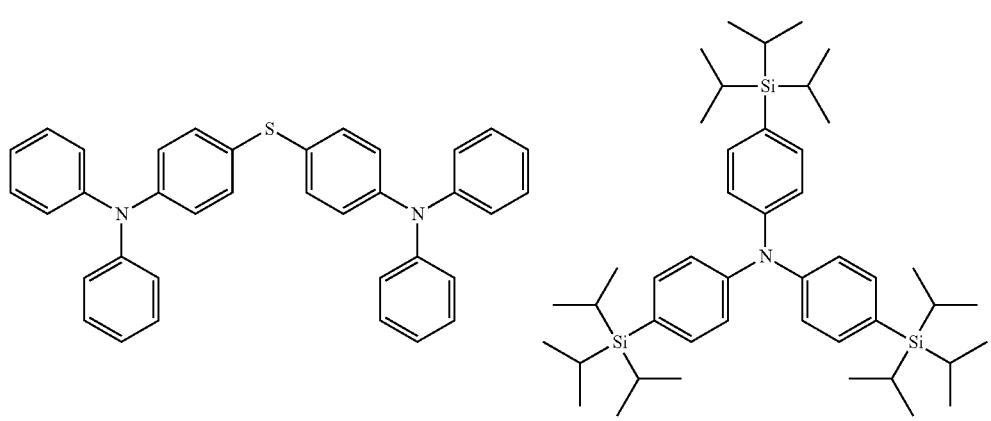
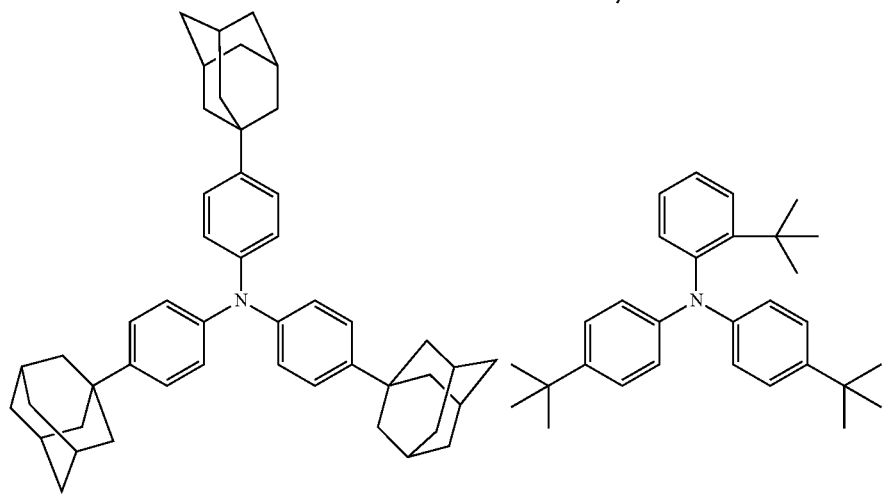

Each of the materials expressed by any of General Formulas 1 to 3 above is composed solely of a triphenylamine skeleton (M) or has a structure in which a triphenylamine skeleton (M) is linked by a non-conjugated group (X). Although the reason is not clear, it is surmised that using a material having a structure such as this for the first hole transport layer increases drive durability because it increases the LUMO of the first hole transport layer and enhances the effect of blocking electrons that have leaked from the light-emitting layer at the interface between the first hole transport layer and the second hole transport layer.

From the standpoint of drive voltage and drive durability, the thickness of the first hole transport layer is preferably at least 1 nm and no more than 50 nm, more preferably at least 3 nm and no more than 30 nm, and even more preferably at least 5 nm and no more than 20 nm.

—Second Hole Transport Layer—

There are no particular restrictions on the material included in the second hole transport layer as long as the energy E1(LUMO) of the LUMO of the material included in the first hole transport layer and the energy E2(LUMO) of the LUMO of the material included in the second hole transport layer satisfy the aforementioned relationship.

The second hole transport layer can include two or more types of material, but is preferably made up of just one type of material.

From the standpoint of improving the initial durability of the element, the second hole transport layer preferably includes at least one type of material expressed by one of General Formulas 4 and 5 below. Moreover, it is more preferable if the second hole transport layer is made up of just one type of material expressed by one of General Formulas 4 and 5 below.

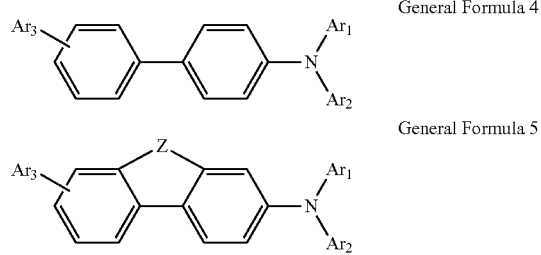

General Formula 4

General Formula 5

$Ar_1$ and $Ar_2$ represent each independently an aryl group. The aryl group of $Ar_1$ and $Ar_2$ may be substituted with an alkyl group, an aryl group, or an amino group.

The aryl group expressed by $Ar_1$ and $Ar_2$ is preferably a $C_6$ to $C_{30}$ aryl group, more preferably a $C_6$ to $C_{20}$ aryl group, and particularly preferably a $C_6$ to $C_{12}$ aryl group. The aryl group expressed by $Ar_1$ and $Ar_2$ is particularly preferably a phenyl group, a biphenyl group, a terphenyl group, a naphthyl group, an anthracenyl group, or a phenanthryl group, and most preferably a phenyl group, a biphenyl group, or a phenanthryl group.

The alkyl group with which the aryl group expressed by $Ar_1$ and $Ar_2$ may be substituted is a straight-chain or branched alkyl group, preferably a $C_1$ to $C_{18}$ alkyl group, more preferably a $C_1$ to $C_{12}$ alkyl group, and even more preferably a $C_1$ to $C_6$ alkyl group. The alkyl group with which the aryl group expressed by $Ar_1$ and $Ar_2$ may be substituted is particularly preferably a methyl group, an ethyl group, an n-propyl group, an i-propyl group, an n-butyl group, a t-butyl group, an i-butyl group, an n-pentyl group, a neopentyl group, a t-amyl group, an s-isoamyl group, or an n-hexyl group, and most preferably a methyl group or a t-butyl group.

The aryl group with which the aryl group expressed by $Ar_1$ and $Ar_2$ may be substituted is the same as the aryl group expressed by $Ar_1$ and $Ar_2$, and the preferable ranges are also the same.

The amino group with which the aryl group expressed by $Ar_1$ and $Ar_2$ may be substituted is preferably a $C_0$ to $C_{30}$ amino group, more preferably a $C_0$ to $C_{20}$ amino group, and particularly preferably a $C_0$ to $C_{10}$ amino group. The amino group with which the aryl group expressed by $Ar_1$ and $Ar_2$ may be substituted is particularly preferably a dimethylamino group, a diethylamino group, a dibenzylamino group, a diphenylamino group, or a ditolylamino group.

The alkyl group, aryl group, and amino group with which the aryl group expressed by $Ar_1$ and $Ar_2$ may be substituted may form a ring with the aryl group expressed by $Ar_1$ and $Ar_2$.

$Ar_3$ represents an amino group substituted with an alkyl group or an aryl group. The aryl group substituted on the amino group of $Ar_3$ may be further substituted with an alkyl group, an aryl group, or an amino group, and the alkyl group or aryl group substituted on the amino group of $Ar_3$ may form a ring by bonding to another alkyl group or aryl group substituted on the amino group of $Ar_3$.

The alkyl group substituted on the amino group expressed by $Ar_3$ is the same as the alkyl group with which the aryl group expressed by $Ar_1$ and $Ar_2$ may be substituted, and the preferable ranges are also the same.

The aryl group substituted on the amino group expressed by $Ar_3$ is the same as the aryl group with which the aryl group expressed by $Ar_1$ and $Ar_2$ may be substituted, and the preferable ranges are also the same.

The alkyl group, aryl group, and amino group with which the aryl group substituted on the amino group expressed by $Ar_3$ may be substituted are the same as the alkyl group, aryl group, and amino group with which the aryl group expressed by $Ar_1$ and $Ar_2$ may be substituted, and the preferable ranges are also the same.

Z represents one of the following structures:

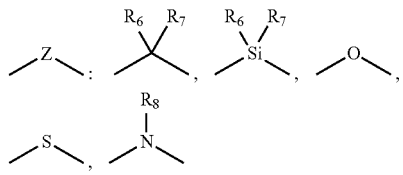

$R_6$ to $R_8$ represent each independently an alkyl group or an aryl group.

The aryl group of $R_6$ to $R_8$ may be substituted with an alkyl group, an aryl group, or an amino group.

The alkyl group expressed by $R_6$ to $R_8$ is a straight-chain or branched alkyl group, preferably a $C_1$ to $C_{18}$ alkyl group, more preferably a $C_1$ to $C_{12}$ alkyl group, and even more preferably a $C_1$ to $C_6$ alkyl group. The alkyl group expressed by $R_1$, $R_2$, and $R_3$ [sic]² is particularly preferably a methyl group, an ethyl group, an n-propyl group, an i-propyl group, an n-butyl group, a t-butyl group, an i-butyl group, an n-pentyl group, a neopentyl group, a t-amyl group, an s-isoamyl group, or an n-hexyl group, and most preferably a methyl group or a t-butyl group.

[2] Translator's note: apparent error in the original; "$R_1$, $R_2$, and $R_3$" should be "$R_6$ to $R_8$."

The aryl group expressed by $R_6$ to $R_8$ is preferably a $C_6$ to $C_{30}$, more preferably $C_6$ to $C_{20}$, and even more preferably $C_6$ to $C_{12}$ aryl group. The aryl group expressed by $Ar_1$ and $Ar_2$ [sic][3] is particularly preferably a phenyl group, a biphenyl group, a terphenyl group, a naphthyl group, an anthracenyl group, or a phenanthryl group, and most preferably a phenyl group, a biphenyl group, or a phenanthryl group.

[3] Translator's note: apparent error in the original; "$Ar_1$ and $Ar_2$" should be "$R_6$ to $R_8$."

The alkyl group, aryl group, and amino group with which the aryl group expressed by $R_6$ to $R_8$ may be substituted are the same as the alkyl group, aryl group, and amino group with which the aryl group expressed by $Ar_1$ and $Ar_2$ may be substituted, and the preferable ranges are also the same.

Z is preferably one of the following structures:

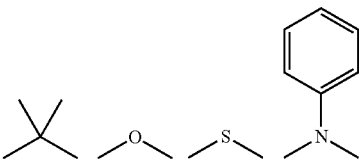

The following materials are examples of preferred modes of the material expressed by General Formulas 4 and 5 above:

[Ninetheenth Chemical Formula]

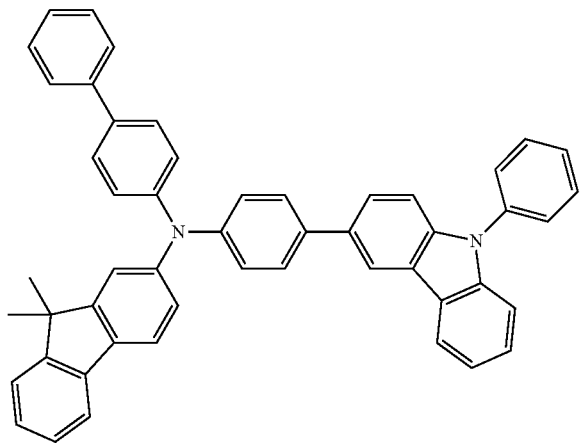

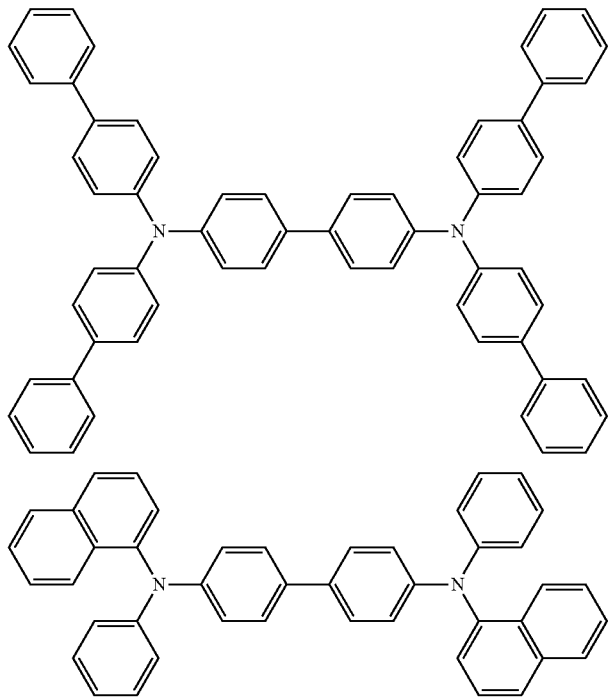

-continued
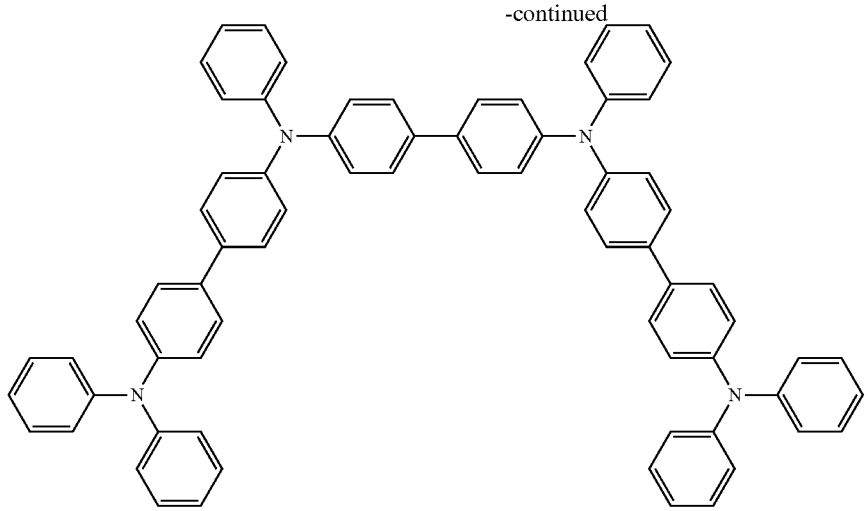
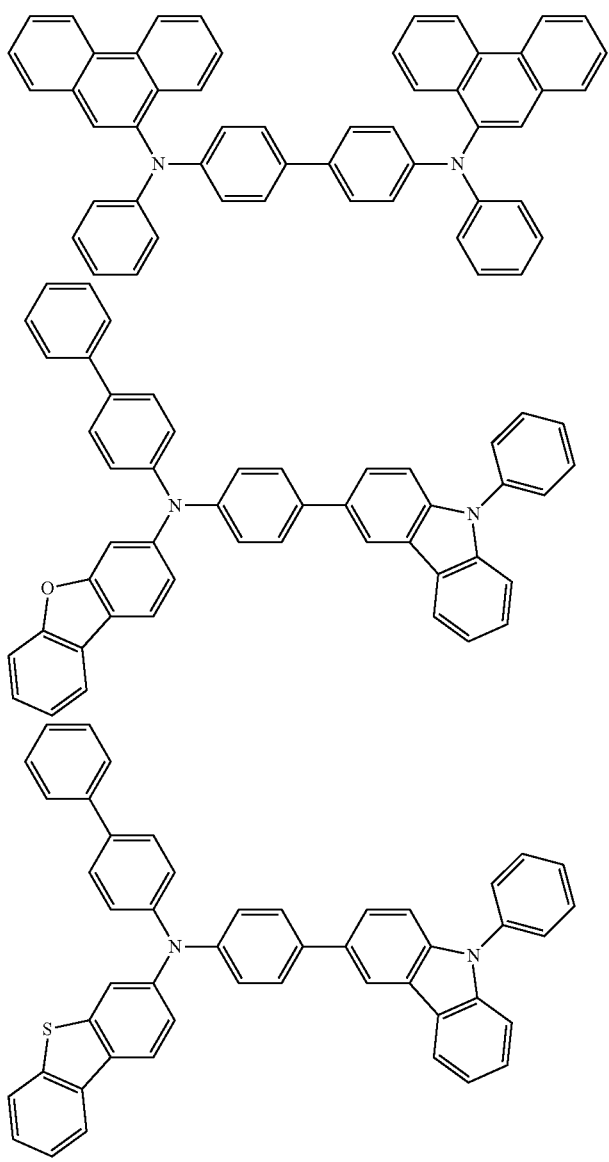

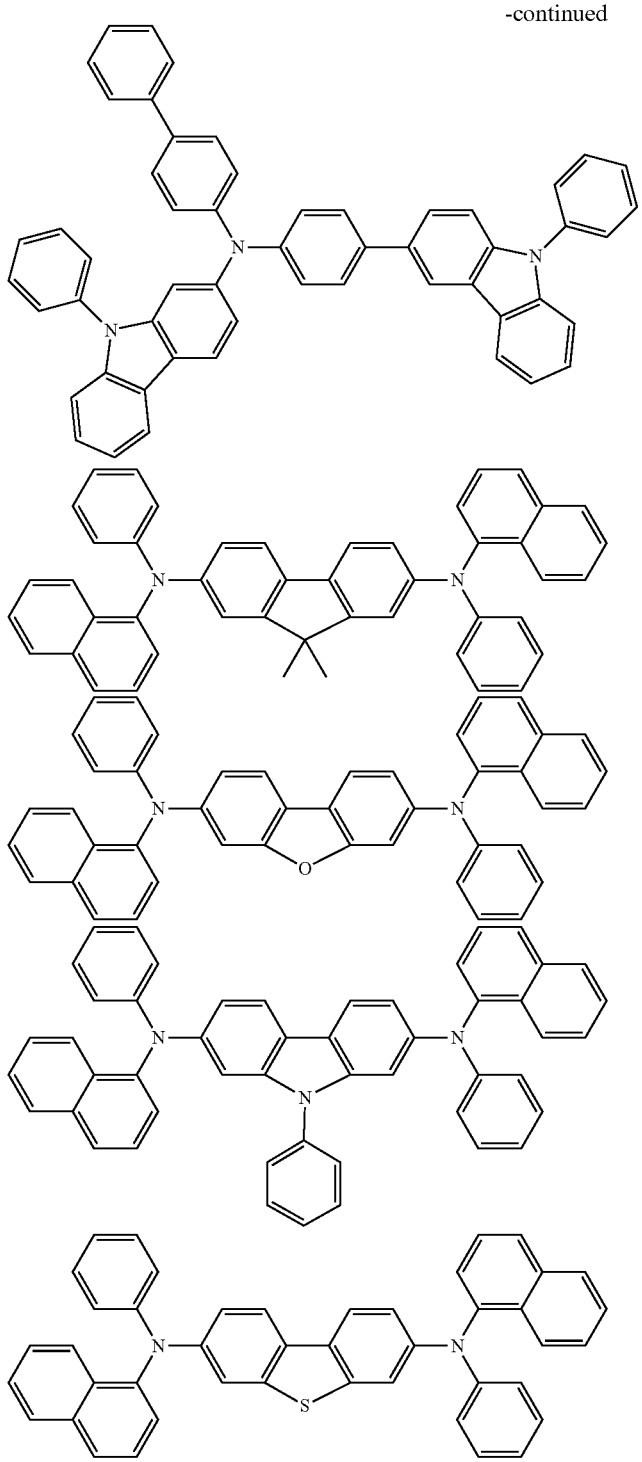

Although the reason is not clear, it is surmised that using the material expressed by General Formula 4 or 5 above in the second hole transport layer lowers the LUMO of the second hole transport layer and increases the effect of blocking electrons that have leaked from the light-emitting layer at the interface between the first hole transport layer and the second hole transport layer, and therefore enhances drive durability.

From the standpoints of drive voltage and drive durability, the thickness of the second hole transport layer is preferably at least 1 nm and no more than 50 nm, more preferably at least 3 nm and no more than 30 nm, and even more preferably at least 5 nm and no more than 20 nm.

(Light-Emitting Layer)

In the organic electroluminescent element of the present invention, the light-emitting layer either can contain just a light-emitting material or can contain a light-emitting dopant and a host material. The light-emitting layer can also contain other components as needed.

The aforementioned light-emitting dopant and host material may be a combination of a host material and a fluorescent material that emits light (fluorescent light) from singlet excitons or a combination of a host material and a phosphorescent material that emits light (phosphorescent light) from triplet excitons. Of these, a combination of a host material and a phosphorescent material is particularly favorable from the standpoint of luminous efficiency. In addition, the aforementioned phosphorescent material is preferably an iridium complex from the standpoint of luminous efficiency.

Note that the aforementioned light-emitting layer can contain two or more kinds of light-emitting dopant in order to increase color purity or to widen the emission wavelength band.

—Light-Emitting Dopant—

Either a phosphorescent material or a fluorescent material can be used as the aforementioned light-emitting dopant.

—Phosphorescent Material—

There are no particular restrictions on the aforementioned phosphorescent material, which can be suitably selected according to the intended use, [but] examples include complexes containing transition metal atoms and lanthanoid atoms.

Examples of the aforementioned transition metal atoms include ruthenium, rhodium, palladium, tungsten, rhenium, osmium, iridium, and platinum. Of these, rhenium, iridium, and platinum are favorable, and iridium and platinum are particularly favorable.

Examples of the aforementioned lanthanoid atoms include lanthanum, cerium, praseodymium, neodymium, samarium, europium, gadolinium, terbium, dysprosium, holmium, erbium, thulium, ytterbium, and lutetium. Of these, neodymium, europium, and gadolinium are particularly favorable.

Examples of ligands of the aforementioned complex include those discussed in "Comprehensive Coordination Chemistry," by G. Wilkinson et al., Pergamon Press (1987), "Photochemistry and Photophysics of Coordination Compounds," by H. Yersin, Springer-Verlag (1987), and "Yuuki Kinzoku Kagaku—Kiso to Ouyou [Organometallic Chemistry—Fundamentals and Applications]," by A. Yamamoto, Shokabo (1982).

Concrete examples of ligands include a halogen ligand (preferably a chlorine ligand), an aromatic carbon ring ligand (such as a cyclopentadienyl anion, a benzene anion, or a naphthyl anion), a nitrogen-containing heterocyclic ligand (such as phenylpyridine, benzoquinoline, quinolinol, bipyridyl, or phenanthroline), a diketone ligand (such as acetylacetone), a carboxylic acid ligand (such as an acetic acid ligand), an alcoholate ligand (such as a phenolate ligand), a carbon monoxide ligand, an isonitrile ligand, and a cyano ligand. Of these, a nitrogen-containing heterocyclic ligand is particularly favorable.

The aforementioned complex may have just one transition metal atom in the compound, or may be a so-called dinuclear complex having two or more transition metal atoms. Different kinds of metal atoms may be contained at the same time. Of these, the following are examples of phosphorescent materials, but the phosphorescent materials are not limited to these.

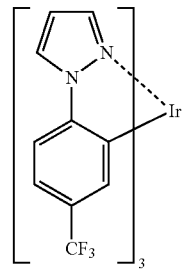

D-1

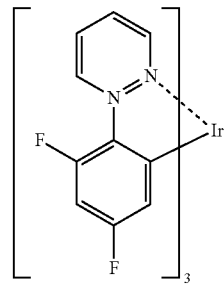

D-2

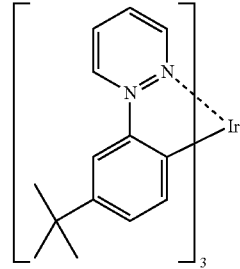

D-3

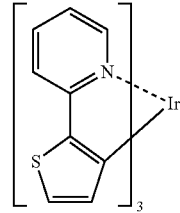

D-4

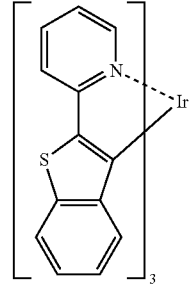

D-5

-continued
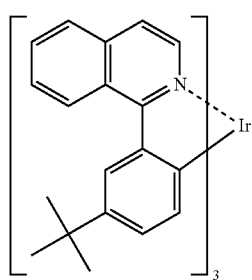
D-6
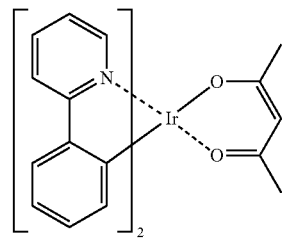
D-11
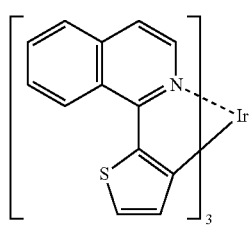
D-7
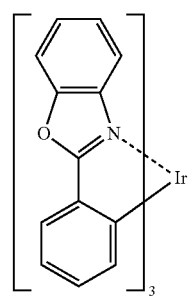
D-12
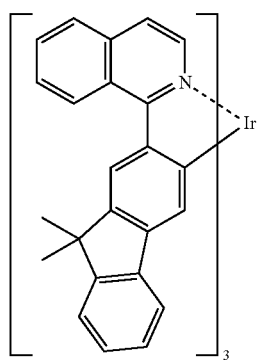
D-8
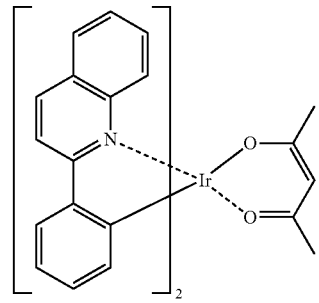
D-13
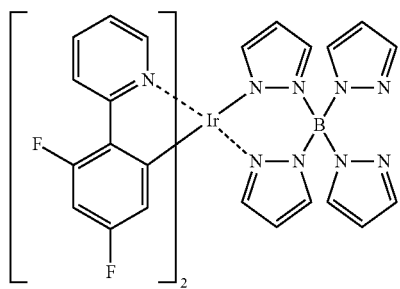
D-9
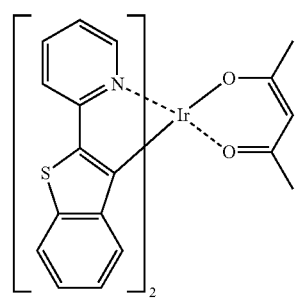
D-14
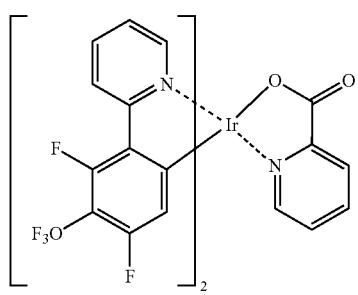
D-10
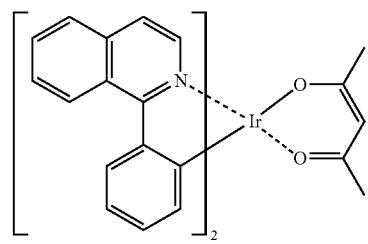
D-15
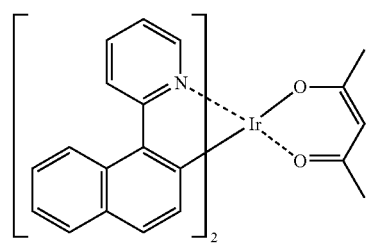
D-16

D-17
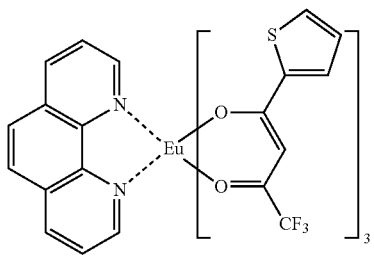
D-18
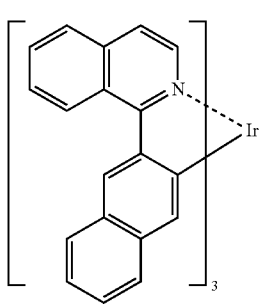
D-19
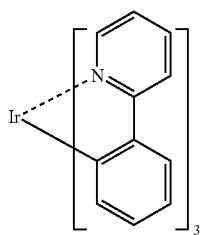
D-20
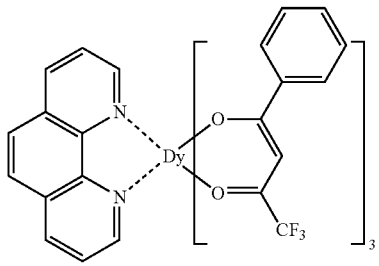
D-21
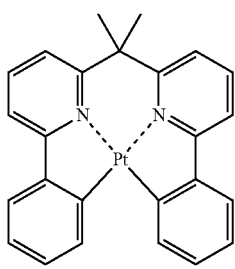
D-22
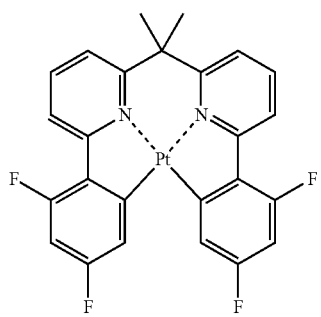
D-23
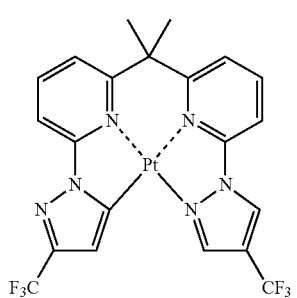
D-24
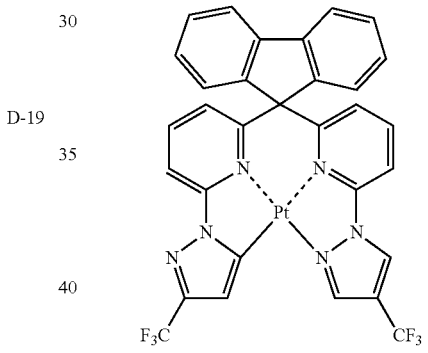
D-25
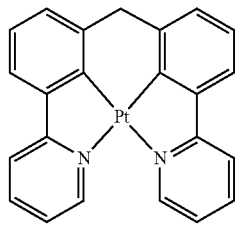
D-26
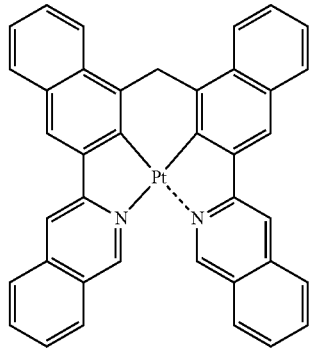

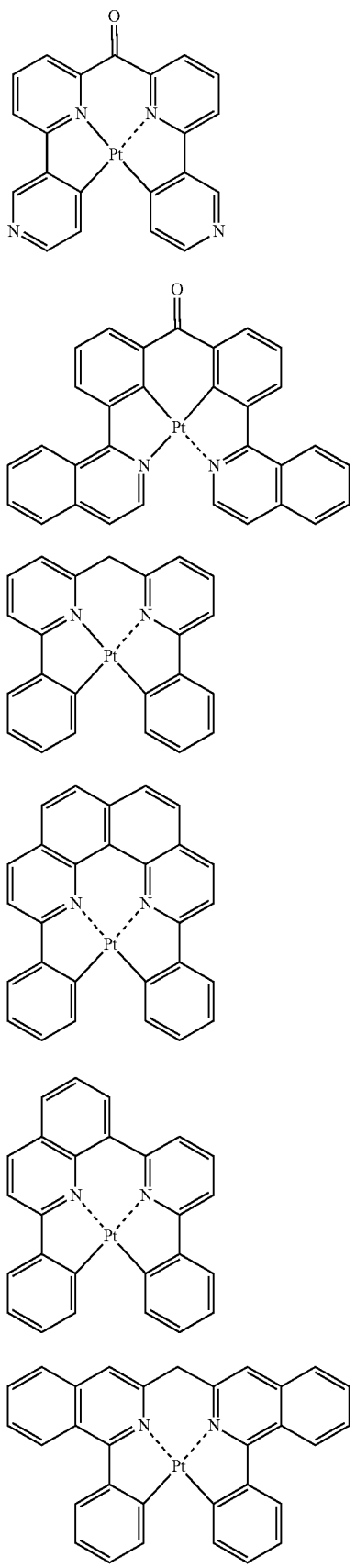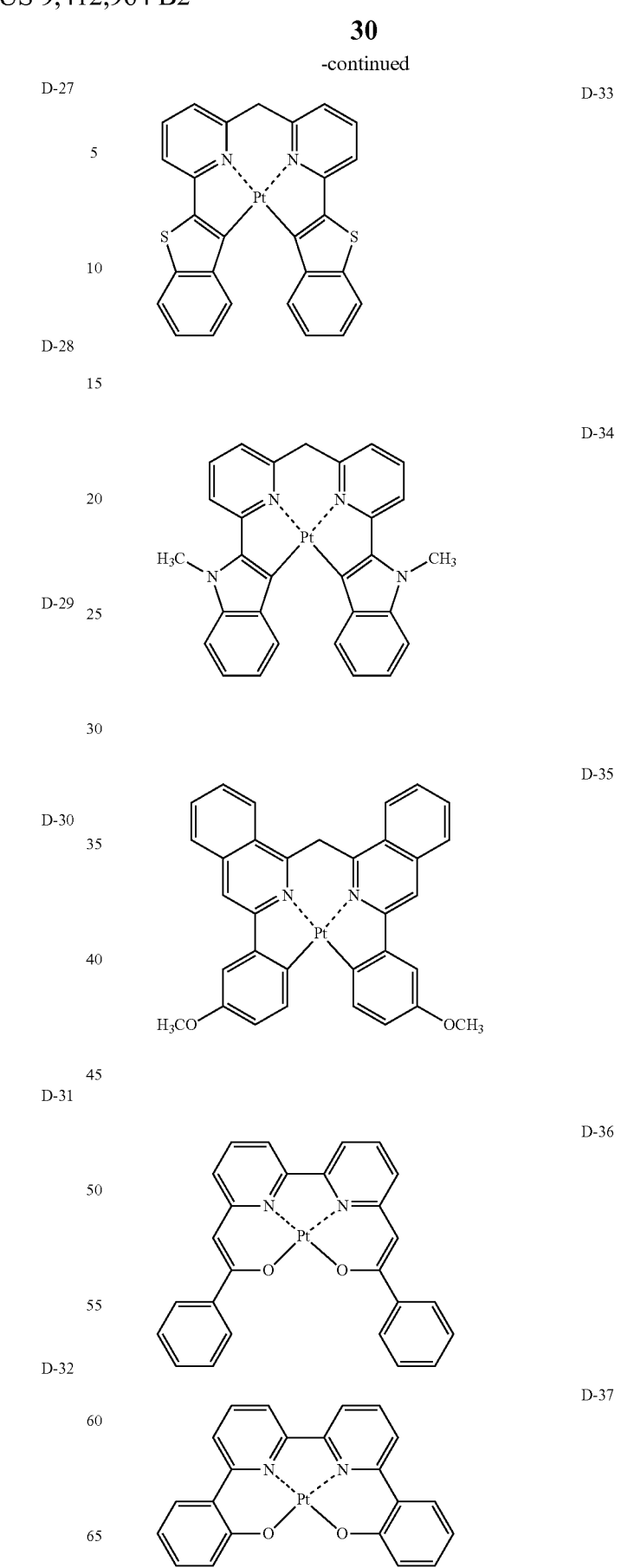

-continued
D-38 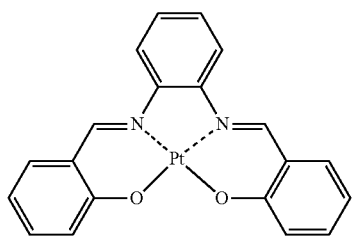
D-39 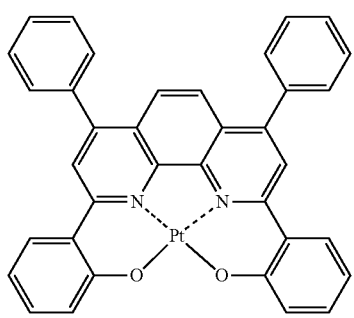
D-40 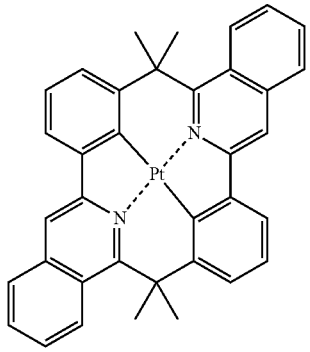
D-41 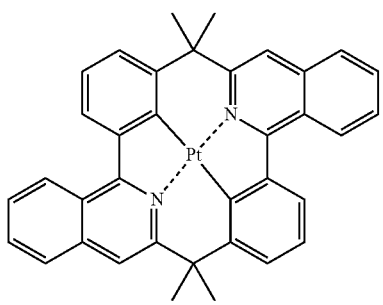
D-42 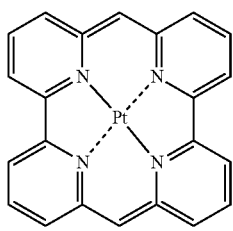
-continued
D-43 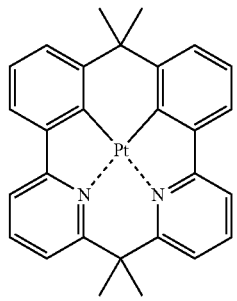
D-44 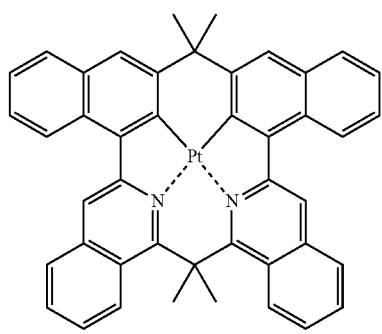
D-45 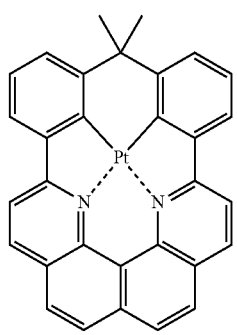
D-46 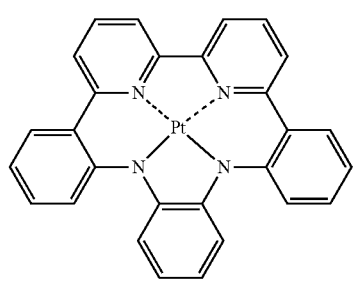
D-47 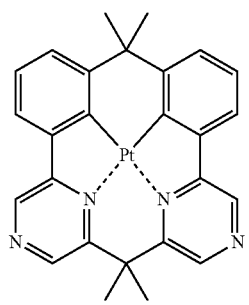

-continued
D-48
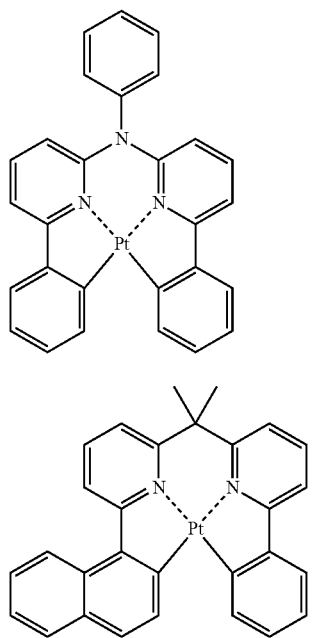
D-49
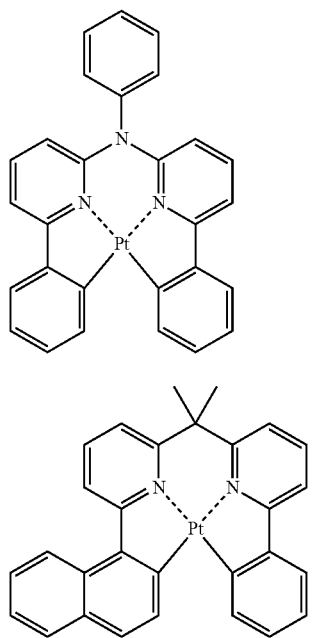
D-50
D-51
D-52
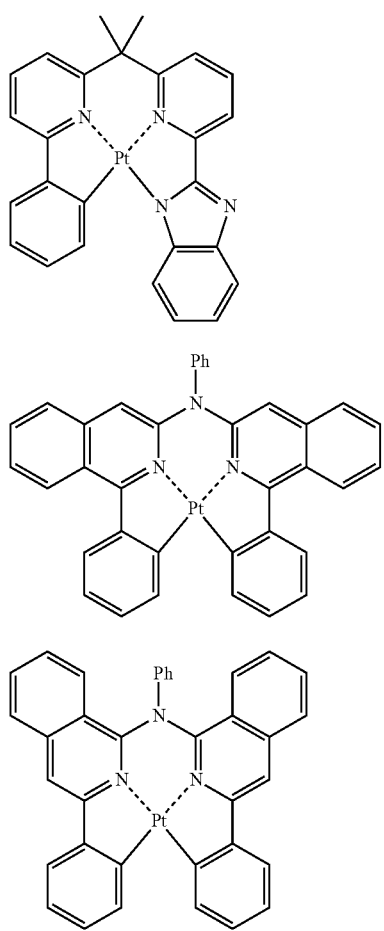
-continued
D-53
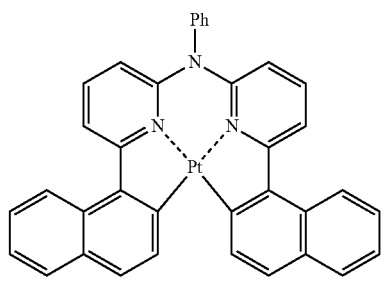
D-54
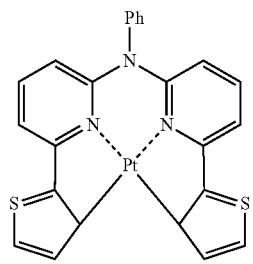
D-55
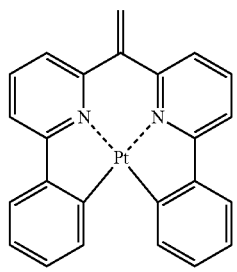
D-56
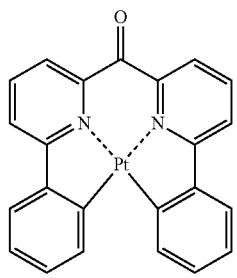
D-57
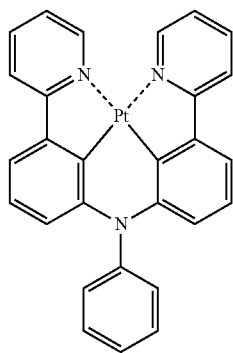

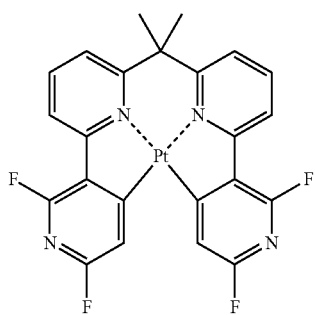
D-58

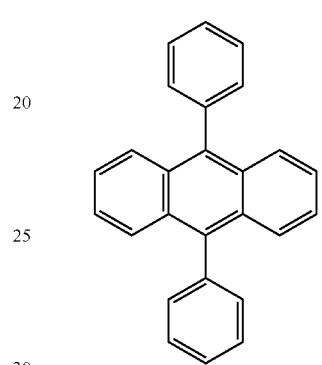
D-59

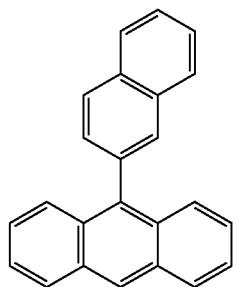
D-60

The amount in which the aforementioned phosphorescent material is contained is preferably 0.5 to 40 wt %, more preferably 1 to 30 wt %, and even more preferably 3 to 20 wt %, with respect to the total weight of the material forming the aforementioned light-emitting layer.

If the aforementioned content is at least 0.5 wt %, there will be no worry that the luminous efficiency will be lower, and if the content is no more than 40 wt %, there will be no worry that luminous efficiency will decrease due to the association of the phosphorescent material itself, so [the aforementioned range] is preferable.

—Fluorescent Material—

There are no particular restrictions on the aforementioned fluorescent material, which can be suitably selected according to the intended use, [but] examples include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bisstyrylanthracene, quinacridon, pyrrolopyridine, thiadiazolopyridine, cyclopentadiene [sic][4], styrylamine, aromatic dimethylidyne compounds, condensed polycyclic aromatic compounds (such as anthracene, phenanthroline, pyrene, perylene, rubrene, and pentacene), various metal complexes typified by a metal complex of 8-quinolinol, a pyrromethene complex, and a rare earth complex, polymer compounds such as polythiophene, polyphenylene, and polyphenylenevinylene, organosilanes, and derivatives of these.

[4] Translator's note: "Cyclopentadiene" is repeated in this list in the original.

Of these, concrete examples of the aforementioned fluorescent material include those listed below, but are not limited to these.

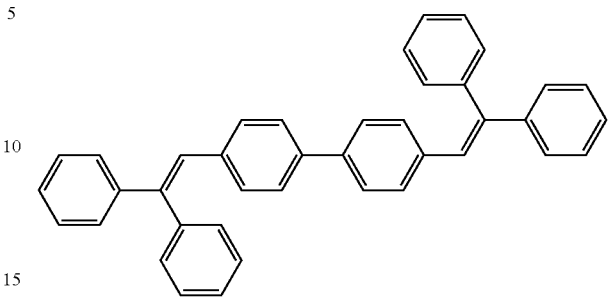
L-1

L-2

L-3

L-4

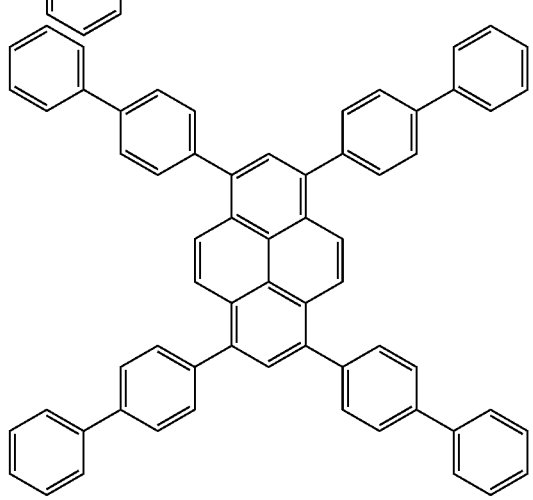

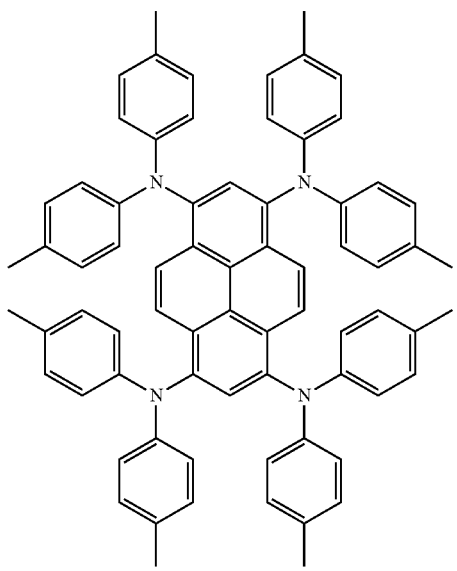
L-5

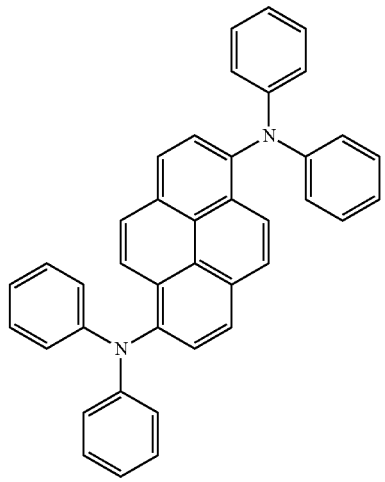
L-10

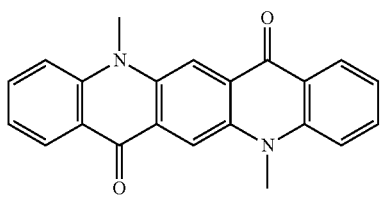
L-6

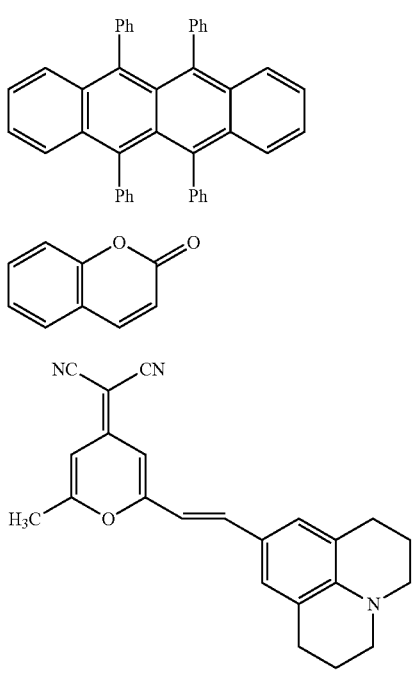

(Electron Transport Layer)

From the standpoints of drive voltage and luminous efficiency, the organic electroluminescent element of the present invention preferably further has an electron transport layer between the light-emitting layer and the cathode.

There are no particular restrictions on the material used for the electron transport layer as long as it is an electron transporting material.

The following materials are examples of preferred modes of the material used for the electron transport layer:

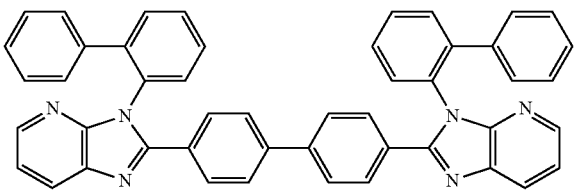
L-7

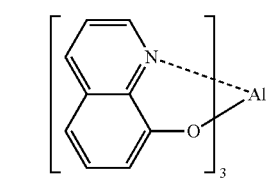
L-8

From the standpoints of drive voltage and luminous efficiency, the thickness of the electron transport layer is preferably at least 5 nm and no more than 80 nm, more preferably at least 10 nm and no more than 60 nm, and even more preferably at least 15 nm and no more than 40 nm.

(Hole Blocking Layer)

The hole blocking layer is a layer having the function of preventing the holes transported from the anode side to the light-emitting layer from escaping to the cathode side. In the present invention, a hole blocking layer can be provided as an organic layer that is adjacent to the light-emitting layer on the cathode side.

Examples of materials that constitute a hole blocking layer include aluminum(III) bis(2-methyl-8-quinolinato) 4-phenylphenolate (abbreviated as BAlq) and other such aluminum complexes, triazole derivatives, and phenanthroline derivatives such as 2,9-dimethyl-4,7-diphenyl-1,10-phenanthroline (abbreviated as BCP). In the present invention, the hole blocking layer is not limited to a function of actually blocking holes and may have the function of blocking energy transfer quenching or not diffusing excitons of the light-emitting layer in the electron transport layer.

The thickness of the hole blocking layer is preferably 1 to 500 nm, more preferably 5 to 200 nm, and even more preferably 10 to 100 nm.

The hole blocking layer may have a single-layer structure composed of one or more types of the aforementioned materials or may have a multilayer structure composed of a plurality of layers of the same composition or different compositions.

(Protective Layer)

In the present invention, the entire organic electroluminescent element may be protected by a protective layer.

For the protective layer, what is stated in paragraph numbers [0169] and [0170] in Japanese Laid-Open Patent Application 2008-270736 can be applied to the present invention.

(Sealing Container)

With the organic electroluminescent element of the present invention, it is also possible to use a sealing container to seal the entire element.

For the sealing container, what is stated in paragraph number [0171] in Japanese Laid-Open Patent Application 2008-270736 can be applied to the present invention.

(Drive)

The organic electroluminescent element of the present invention can emit light with the application of direct current (may include an alternating current component as needed) voltage (usually 2 to 15 volts) or DC current between the anode and the cathode.

For the method for driving the organic electroluminescent element of the present invention, it is possible to apply the drive methods discussed in the Specifications or the like of Japanese Laid-Open Patent Applications H2-148687, H6-301355, H5-29080, H7-134558, H8-234685, and H8-241047, Japanese Patent 2,784,615, and U.S. Pat. Nos. 5,828,429 and 6,023,308.

(Application of the Element of the Present Invention)

The element of the present invention can be applied favorably in display elements, displays, backlights, electronic photography, illumination light sources, recording light sources, exposure light sources, reading light sources, road signs, trade signs, interior decorating, optical communications, and so forth. [This element] can be used particularly favorably in display devices such as displays requiring the element to have a high level of initial durability.

(Light-Emitting Device)

Next, the light-emitting device of the present invention will be described through reference to FIG. 2.

The light-emitting device of the present invention is constituted with the use of the aforementioned organic electroluminescent element.

Figure 2:
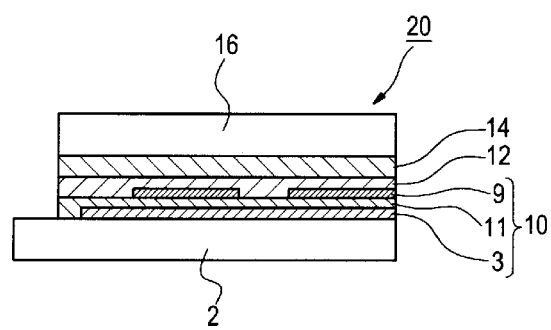
FIG. 2 is a schematic diagram showing one example of the light-emitting device according to the present invention.

FIG. 2 is a sectional view schematically showing one example of the light-emitting device of the present invention. The light-emitting device 20 in FIG. 2 is configured from a substrate (supporting substrate) 2, an organic electroluminescent element 10, a sealing container 16, and the like.

The organic electroluminescent element 10 is configured such that an anode (first electrode) 3, an organic layer 11, and a cathode (second electrode) 9 are laminated in this order on the substrate 2. Furthermore, a protective layer 12 is laminated on the cathode 9, and the sealing container 16 is further provided on the protective layer 12 via an adhesive layer 14. Note that parts of the respective electrodes 3 and 9, partitions, insulating layers, and so forth are omitted.

Here, an epoxy resin or other such photosetting adhesive or thermosetting adhesive can be used as the adhesive layer 14, and a thermosetting adhesive sheet, for example, can also be used.

There are no particular restrictions on the applications of the light-emitting device of the present invention. For example, besides lighting devices, it is possible to constitute display devices such as television sets, personal computers, portable telephones, and electronic paper.

(Lighting Devices)

Next, the lighting device of the present invention will be described through reference to FIG. 3.

Figure 3:
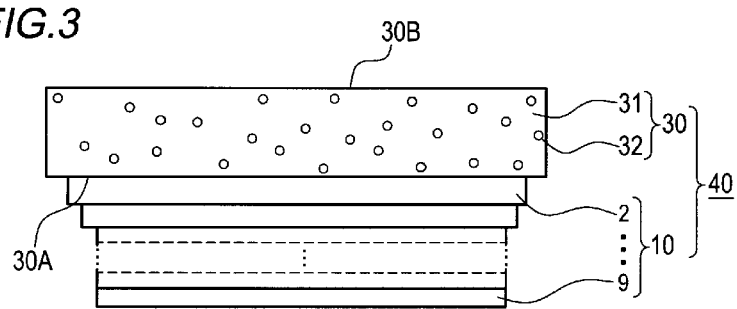
FIG. 3 is a schematic diagram showing one example of the lighting device according to the present invention.

FIG. 3 is a sectional view schematically showing one example of the lighting device of the present invention. The lighting device 40 of the present invention comprises the aforementioned organic EL element 10 and a light scattering member 30 as shown in FIG. 3. More concretely, the lighting device 40 is configured such that the substrate 2 of the organic EL element 10 is in contact with the light scattering member 30.

There are no particular restrictions on the light scattering member 30 as long as it is capable of scatting light, but in FIG. 3, it is a member in which microparticles 32 are dispersed in a transparent substrate 31. A glass substrate, for example, can be used favorably as the transparent substrate 31. Transparent resin microparticles can be a favorable example as the microparticles 32. The glass substrate and the transparent resin microparticles can both be from prior art. This type of lighting device 40 is such that when light emitted from the organic electroluminescent element 10 is incident on a light incidence face 30A of the light scattering member 30, the incident light is scattered by the light scattering member 30, and the scattered light exits a light emission face 30B as illuminating light.

WORKING EXAMPLES

The present invention will now be described in further detail based on working examples, but the present invention is not limited to or by these.

<Calculation of HOMO and LUMO>

For the values for HOMO and LUMO of the various materials used in the working examples, Gaussian 09, which is molecular orbital calculation software made by the U.S. company Gaussian, is used to perform structural optimization calculation with the use of density functional theory (B3LYP/6–31G(d)), and the resulting values were then converted into electron-volt units (eV).

—Calculation of HOMO and LUMO of Material Used for Hole Injection Layer—

HOMO and LUMO were calculated for the following materials HI-1 to HI-3. The results are given in Table 1.

HI-1

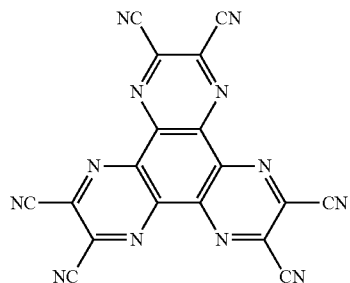

HI-2

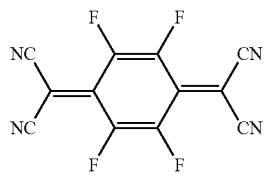

HI-3

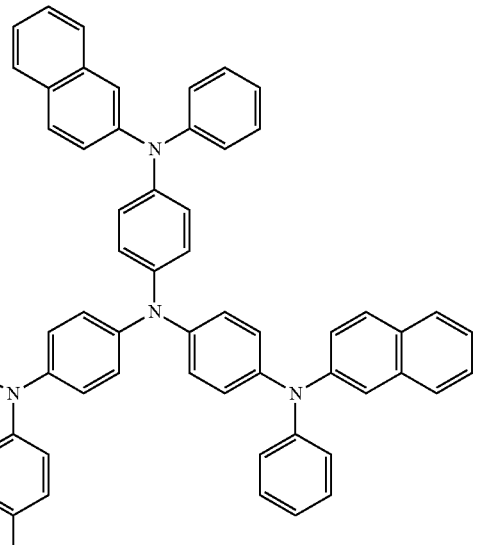

TABLE 1

|  | HOMO (eV) | LUMO (eV) |
|---|---|---|
| HI-1 | −8.84 | −4.61 |
| HI-2 | −7.61 | −5.25 |
| HI-3 | −4.51 | −1.23 |

—Calculation of HOMO and LUMO of Material Used for Hole Transport Layer—

The HOMO and LUMO were calculated for the following materials A-1 to A-11, B-1 to B-6, and C-1. The results are given in Table 2.

A-1

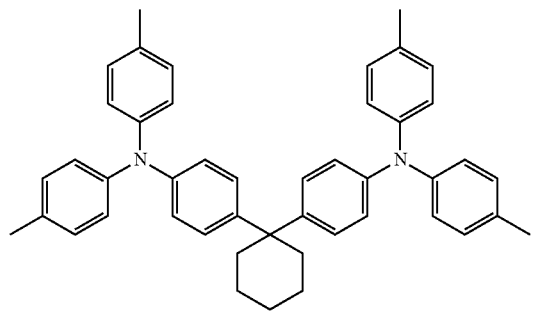

A-2

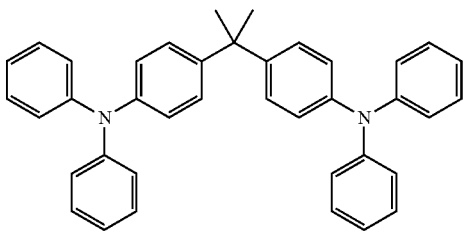

-continued
A-3
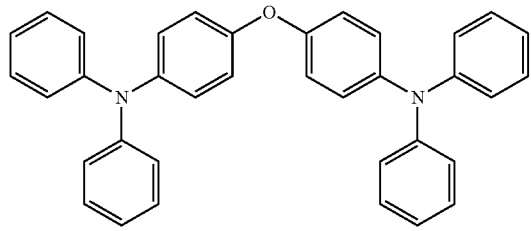
A-4
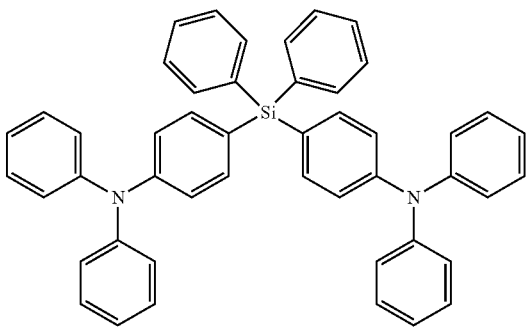
A-5
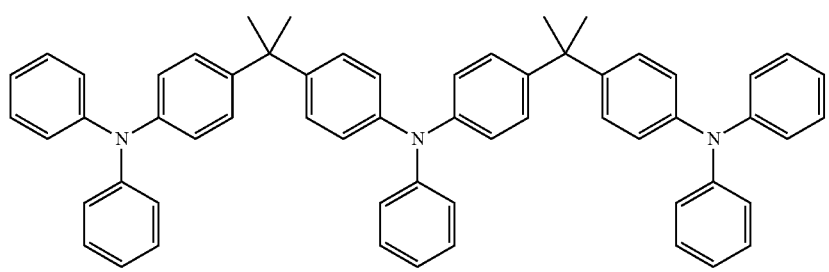
A-6
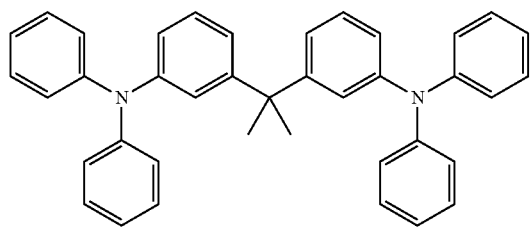
A-7
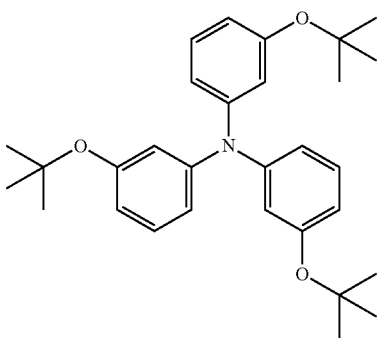
A-8
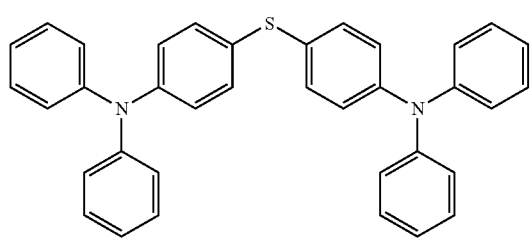
A-9
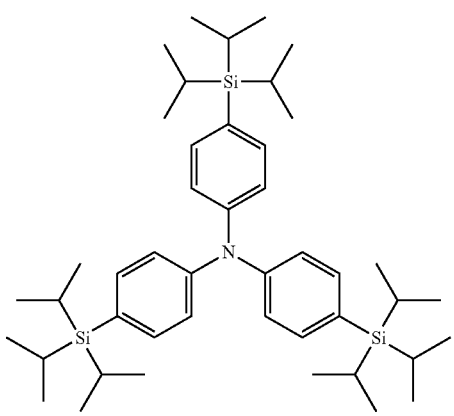

-continued
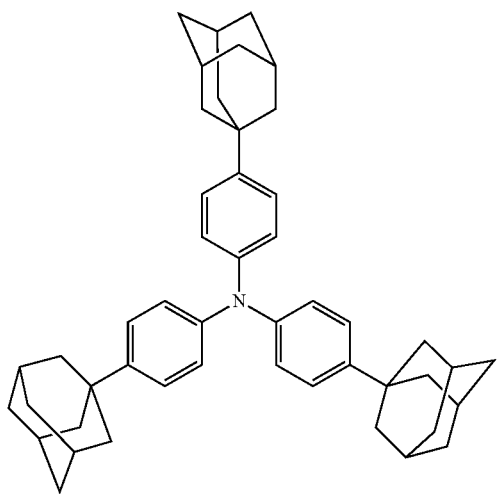
A-10
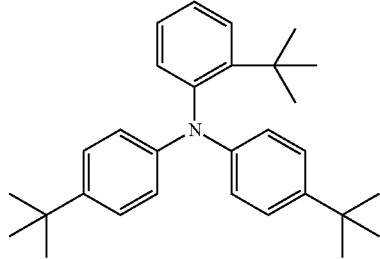
A-11
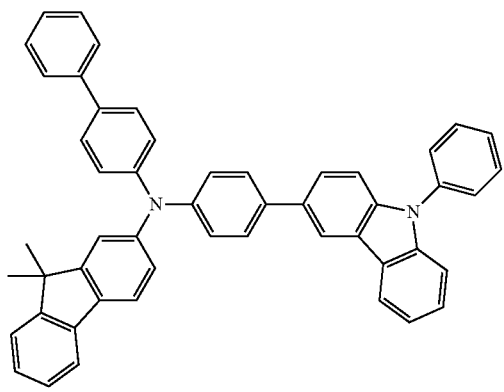
B-1
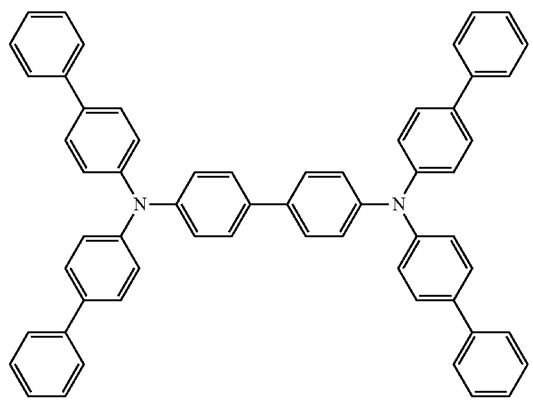
B-2
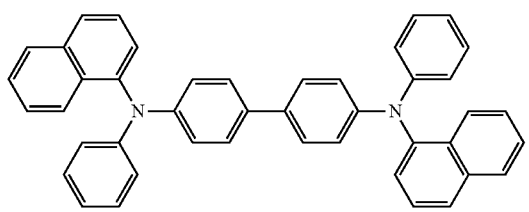
B-3
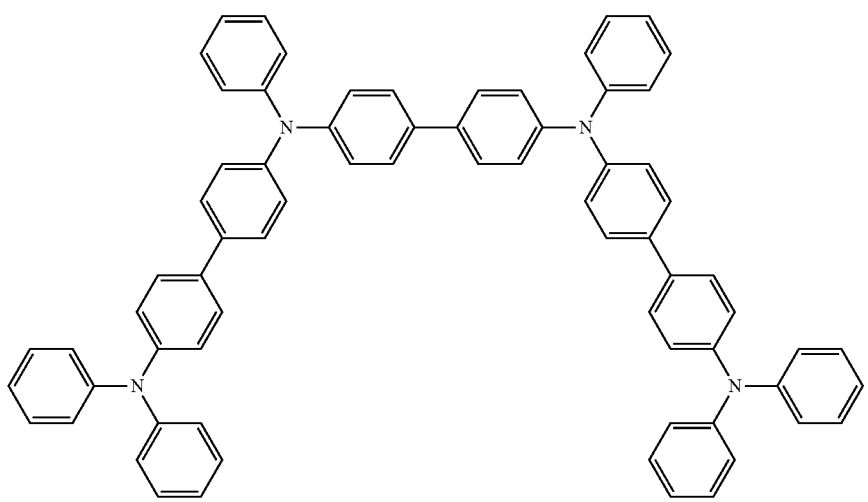
B-4

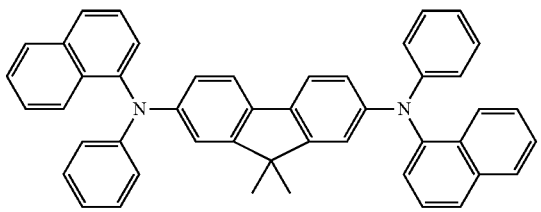

B-5

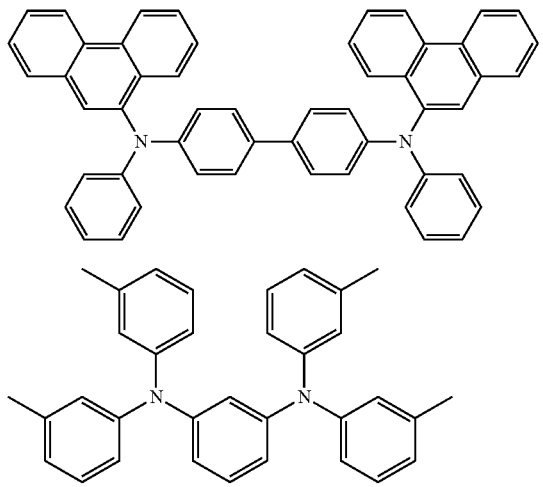

B-6

C-1

TABLE 2

|      | HOMO (eV) | LUMO (eV) |
|------|-----------|-----------|
| A-1  | −4.66     | −0.28     |
| A-2  | −4.83     | −0.33     |
| A-3  | −4.80     | −0.49     |
| A-4  | −4.96     | −0.59     |
| A-5  | −4.77     | −0.34     |
| A-6  | −4.89     | −0.33     |
| A-7  | −4.69     | +0.05     |
| A-8  | −4.83     | −0.62     |
| A-9  | −5.01     | −0.57     |
| A-10 | −4.70     | −0.19     |
| A-11 | −4.89     | −0.28     |
| B-1  | −4.69     | −0.90     |
| B-2  | −4.71     | −1.00     |
| B-3  | −4.73     | −1.13     |
| B-4  | −4.61     | −0.96     |
| B-5  | −4.75     | −1.17     |
| B-6  | −4.61     | −1.31     |
| C-1  | −4.74     | −0.30     |

Production of Organic Electroluminescent Element

Working Example 1

A glass substrate (with a sheet resistance of 10 Ω/sq., made by Geomatec) measuring 2.5 cm square with a thickness of 0.5 mm and having an ITO film with a thickness of 70 nm was put into a washing vessel and ultrasonically washed in 2-propanol, after which a UV-ozone treatment was performed for 30 minutes. The following organic compound layers were successively deposited by vacuum vapor deposition over this transparent anode (ITO film):

Hole injection layer (HTL) [sic][5]: HI-1, 10 nm thickness

[5] Translator's note: apparent error in the original; "(HTL)" should be "(HIL)."

First hole transport layer (HTL (1)): A-1, 15 nm thickness
Second hole transport layer (HTL (2)): B-1, 15 nm thickness
Light-emitting layer (EML): H-1 and EM-1 (weight ratio of 95:5), 30 nm thickness
Electron transport layer (ETL): ET-1, 30 nm thickness
Over this, lithium fluoride (0.1 nm) and metallic aluminum (100 nm) were vapor deposited in this order to form a cathode.

The laminate thus obtained was placed in a glove box that had been replaced with nitrogen gas without being in contact with the air and sealed using a glass sealing can and a UV-setting adhesive (XNR5516HV, made by Nagase Chiba[6]), which gave the organic electroluminescent element of Working Example 1.

[6] Translator's note: "Nagase Chiba" is a predecessor of "Nagase ChemteX"

Working Examples 2 to 24 and Comparative Examples 1 to 21

Other than using the hole injection layer, first hole transport layer, second hole transport layer, light-emitting layer, and electron transport layer of the materials and thicknesses shown in Table 3 instead of the hole injection layer, first hole transport layer, second hole transport layer, light-emitting layer, and electron transport layer in Working Example 1, the organic electroluminescent elements of Working Examples 2 to 24 and Comparative Examples 1 to 21 were obtained in the same manner as in Working Example 1. Note that in Table 3, the "%" given for the components of HIL and EML represents "wt %."

Evaluation

The external quantum efficiency and initial durability (drive durability) of the organic electroluminescent elements thus produced were evaluated as follows: The results are given in Table 4.

Measurement of External Quantum Efficiency

The organic electroluminescent elements were made to emit light by applying a DC constant current with a current density of 25 mA/cm$^2$ using a Source Measure Unit 2400 made by Keithley. The brightness during light emission and the emission spectrum were measured using an SR-3 Spectroradiometer made by Topcon. The external quantum efficiency was calculated from the applied current density and the spectral intensity.

Measurement of Initial Durability

Drive Durability

The organic electroluminescent elements were made to emit light continuously by applying a DC constant voltage of 25 mA/cm² such that the brightness would be 5000 cd/m² at room temperature (20° C.), and the time LT90 (hours) it took for the brightness to reach 90% of the initial brightness was measured.
The structures of compounds other than the compounds listed above and used in Working Examples 1 to 24 and Comparative Examples 1 to 21 are given below.
H-1
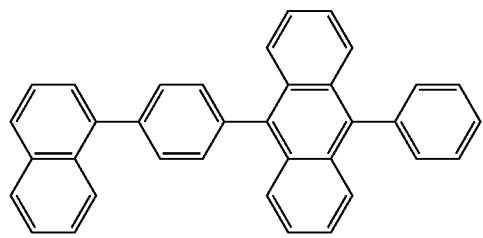
H-2
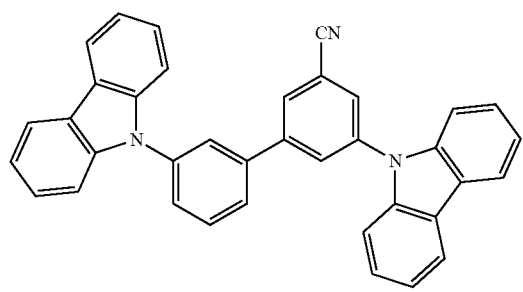
H-3
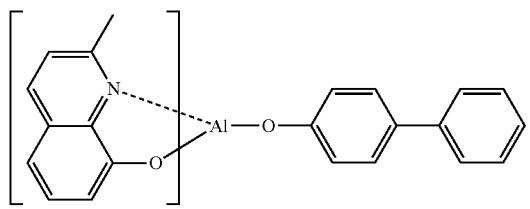
EM-1
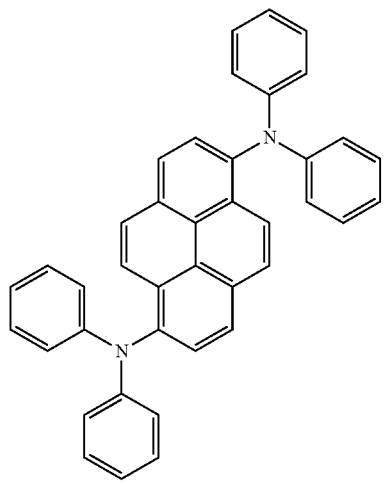
EM-2
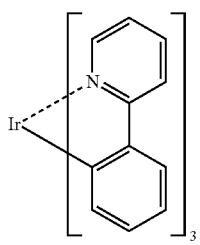
EM-3
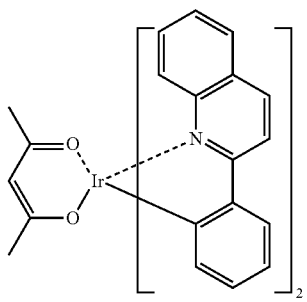
ET-1
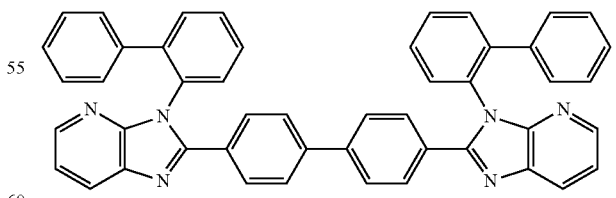
ET-2
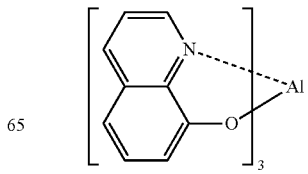

TABLE 3

| | HIL | HTL (1) | HTL (2) | EML | ETL |
|---|---|---|---|---|---|
| Comparative Example 1 | HI-1 (10 nm) | B-1 (30 nm) | none | H-1 [95%] + EM-1 [5%] (30 nm) | ET-1 (30 nm) |
| Comparative Example 2 | HI-1 (10 nm) | B-2 (30 nm) | none | H-1 [95%] + EM-1 [5%] (30 nm) | ET-1 (30 nm) |
| Comparative Example 3 | HI-1 (10 nm) | B-3 (30 nm) | none | H-1 [95%] + EM-1 [5%] (30 nm) | ET-1 (30 nm) |
| Comparative Example 4 | HI-1 (10 nm) | B-4 (30 nm) | none | H-1 [95%] + EM-1 [5%] (30 nm) | ET-1 (30 nm) |
| Comparative Example 5 | HI-1 (10 nm) | B-5 (30 nm) | none | H-1 [95%] + EM-1 [5%] (30 nm) | ET-1 (30 nm) |
| Comparative Example 6 | HI-1 (10 nm) | B-6 (30 nm) | none | H-1 [95%] + EM-1 [5%] (30 nm) | ET-1 (30 nm) |
| Comparative Example 7 | HI-1 (10 nm) | A-1 (30 nm) | none | H-1 [95%] + EM-1 [5%] (30 nm) | ET-1 (30 nm) |
| Comparative Example 8 | HI-1 (10 nm) | A-2 (30 nm) | none | H-1 [95%] + EM-1 [5%] (30 nm) | ET-1 (30 nm) |
| Comparative Example 9 | HI-1 (10 nm) | A-3 (30 nm) | none | H-1 [95%] + EM-1 [5%] (30 nm) | ET-1 (30 nm) |
| Comparative Example 10 | HI-1 (10 nm) | A-4 (30 nm) | none | H-1 [95%] + EM-1 [5%] (30 nm) | ET-1 (30 nm) |
| Comparative Example 11 | HI-1 (10 nm) | A-5 (30 nm) | none | H-1 [95%] + EM-1 [5%] (30 nm) | ET-1 (30 nm) |
| Comparative Example 12 | HI-1 (10 nm) | A-10 (30 nm) | none | H-1 [95%] + EM-1 [5%] (30 nm) | ET-1 (30 nm) |
| Working Example 1 | HI-1 (10 nm) | A-1 (15 nm) | B-1 (15 nm) | H-1 [95%] + EM-1 [5%] (30 nm) | ET-1 (30 nm) |
| Working Example 2 | HI-1 (10 nm) | A-1 (15 nm) | B-2 (15 nm) | H-1 [95%] + EM-1 [5%] (30 nm) | ET-1 (30 nm) |
| Working Example 3 | HI-1 (10 nm) | A-1 (15 nm) | B-3 (15 nm) | H-1 [95%] + EM-1 [5%] (30 nm) | ET-1 (30 nm) |
| Working Example 4 | HI-1 (10 nm) | A-1 (15 nm) | B-4 (15 nm) | H-1 [95%] + EM-1 [5%] (30 nm) | ET-1 (30 nm) |
| Working Example 5 | HI-1 (10 nm) | A-1 (15 nm) | B-5 (15 nm) | H-1 [95%] + EM-1 [5%] (30 nm) | ET-1 (30 nm) |
| Working Example 6 | HI-1 (10 nm) | A-1 (15 nm) | B-6 (15 nm) | H-1 [95%] + EM-1 [5%] (30 nm) | ET-1 (30 nm) |
| Comparative Example 13 | HI-1 (10 nm) | B-1 (15 nm) | A-1 (15 nm) | H-1 [95%] + EM-1 [5%] (30 nm) | ET-1 (30 nm) |
| Comparative Example 14 | HI-1 (10 nm) | B-2 (15 nm) | A-1 (15 nm) | H-1 [95%] + EM-1 [5%] (30 nm) | ET-1 (30 nm) |
| Comparative Example 15 | HI-1 (10 nm) | B-3 (15 nm) | A-1 (15 nm) | H-1 [95%] + EM-1 [5%] (30 nm) | ET-1 (30 nm) |
| Working Example 7 | HI-1 (10 nm) | B-1 (15 nm) | B-2 (15 nm) | H-1 [95%] + EM-1 [5%] (30 nm) | ET-1 (30 nm) |
| Working Example 8 | HI-1 (10 nm) | B-1 (15 nm) | B-3 (15 nm) | H-1 [95%] + EM-1 [5%] (30 nm) | ET-1 (30 nm) |
| Working Example 9 | HI-1 (10 nm) | C-1 (15 nm) | B-3 (15 nm) | H-1 [95%] + EM-1 [5%] (30 nm) | ET-1 (30 nm) |
| Working Example 10 | HI-1 (10 nm) | A-2 (15 nm) | B-3 (15 nm) | H-1 [95%] + EM-1 [5%] (30 nm) | ET-1 (30 nm) |
| Working Example 11 | HI-1 (10 nm) | A-3 (15 nm) | B-3 (15 nm) | H-1 [95%] + EM-1 [5%] (30 nm) | ET-1 (30 nm) |
| Working Example 12 | HI-1 (10 nm) | A-4 (15 nm) | B-3 (15 nm) | H-1 [95%] + EM-1 [5%] (30 nm) | ET-1 (30 nm) |
| Working Example 13 | HI-1 (10 nm) | A-5 (15 nm) | B-3 (15 nm) | H-1 [95%] + EM-1 [5%] (30 nm) | ET-1 (30 nm) |
| Working Example 14 | HI-1 (10 nm) | A-6 (15 nm) | B-3 (15 nm) | H-1 [95%] + EM-1 [5%] (30 nm) | ET-1 (30 nm) |
| Working Example 15 | HI-1 (10 nm) | A-7 (15 nm) | B-3 (15 nm) | H-1 [95%] + EM-1 [5%] (30 nm) | ET-1 (30 nm) |
| Working Example 16 | HI-1 (10 nm) | A-8 (15 nm) | B-3 (15 nm) | H-1 [95%] + EM-1 [5%] (30 nm) | ET-1 (30 nm) |
| Working Example 17 | HI-1 (10 nm) | A-9 (15 nm) | B-3 (15 nm) | H-1 [95%] + EM-1 [5%] (30 nm) | ET-1 (30 nm) |
| Working Example 18 | HI-1 (10 nm) | A-10 (15 nm) | B-3 (15 nm) | H-1 [95%] + EM-1 [5%] (30 nm) | ET-1 (30 nm) |

| | HIL | HTL (1) | HTL (2) | EML | ETL* |
|---|---|---|---|---|---|
| Working Example 19 | HI-1 (10 nm) | A-11 (15 nm) | B-3 (15 nm) | H-1 [95%] + EM-1 [5%] (30 nm) | ET-1 (30 nm) |
| Comparative Example 16 | HI-1 (10 nm) | B-3 (30 nm) | none | H-2 [85%] + EM-2 [15%] (30 nm) | H-2 (10 nm)/ ET-2 (40 nm) |
| Working Example 20 | HI-1 (10 nm) | A-1 (15 nm) | B-3 (15 nm) | H-2 [85%] + EM-2 [15%] (30 nm) | H-2 (10 nm)/ ET-2 (40 nm) |

TABLE 3-continued

| | | | | | |
|---|---|---|---|---|---|
| Comparative Example 17 | HI-1 (10 nm) | B-3 (30 nm) | none | H-3 [85%] + EM-3 [15%] (30 nm) | H-3 (5 nm)/ ET-2 (45 nm) |
| Working Example 21 | HI-1 (10 nm) | A-1 (15 nm) | B-3 (15 nm) | H-3 [85%] + EM-3 [15%] (30 nm) | H-3 (5 nm)/ ET-2 (45 nm) |
| Working Example 22 | HI-1 (10 nm) | A-1 (5 nm) | B-3 (25 nm) | H-1 [95%] + EM-1 [5%] (30 nm) | ET-1 (30 nm) |
| Working Example 23 | HI-1 (10 nm) | A-1 (25 nm) | B-3 (5 nm) | H-1 [95%] + EM-1 [5%] (30 nm) | ET-1 (30 nm) |
| Working Example 24 | HI-2 [1%] + HI-3 [99%] (10 nm) | A-1 (15 nm) | B-3 (15 nm) | H-1 [95%] + EM-1 [5%] (30 nm) | ET-1 (30 nm) |
| Comparative Example 18 | HI-3 (10 nm) | A-1 (15 nm) | B-3 (15 nm) | H-1 [95%] + EM-1 [5%] (30 nm) | ET-1 (30 nm) |
| Comparative Example 19 | none | A-1 (20 nm) | B-3 (20 nm) | H-1 [95%] + EM-1 [5%] (30 nm) | ET-1 (30 nm) |
| Comparative Example 20 | HI-2 [1%] + HI-3 [99%] (10 nm) | B-3 (30 nm) | none | H-1 [95%] + EM-1 [5%] (30 nm) | ET-1 (30 nm) |
| Comparative Example 21 | HI-2 [1%] + HI-3 [99%] (10 nm) | A-1 (30 nm) | none | H-1 [95%] + EM-1 [5%] (30 nm) | ET-1 (30 nm) |

*The ETL in Working Examples 20 and 21 and Comparative Examples 16 and 17 has a two-layer structure. When these two layers are expressed as A/B, A is the layer on the EML side.

TABLE 4

| | External quantum efficiency (%) @ 25 mA/cm² | LT90 (hours) @ 25 mA/cm² | Emission color |
|---|---|---|---|
| Comparative Example 1 | 5.5 | 240 | blue |
| Comparative Example 2 | 5.3 | 200 | blue |
| Comparative Example 3 | 5.0 | 260 | blue |
| Comparative Example 4 | 4.9 | 260 | blue |
| Comparative Example 5 | 5.0 | 240 | blue |
| Comparative Example 6 | 5.1 | 250 | blue |
| Comparative Example 7 | 5.9 | 1 or less | blue |
| Comparative Example 8 | 5.7 | 1 or less | blue |
| Comparative Example 9 | 5.7 | 1 or less | blue |
| Comparative Example 10 | 5.6 | 1 or less | blue |
| Comparative Example 11 | 5.8 | 1 or less | blue |
| Comparative Example 12 | 5.5 | 1 or less | blue |
| Working Example 1 | 5.5 | 1100 | blue |
| Working Example 2 | 5.4 | 900 | blue |
| Working Example 3 | 5.4 | 1200 | blue |
| Working Example 4 | 5.3 | 1250 | blue |
| Working Example 5 | 5.4 | 1100 | blue |
| Working Example 6 | 5.4 | 1200 | blue |
| Comparative Example 13 | 5.9 | 1 or less | blue |
| Comparative Example 14 | 5.8 | 1 or less | blue |
| Comparative Example 15 | 5.9 | 1 or less | blue |
| Working Example 7 | 5.4 | 300 | blue |
| Working Example 8 | 5.1 | 350 | blue |
| Working Example 9 | 5.2 | 600 | blue |
| Working Example 10 | 5.3 | 1000 | blue |
| Working Example 11 | 5.4 | 1100 | blue |
| Working Example 12 | 5.3 | 1250 | blue |
| Working Example 13 | 5.4 | 1200 | blue |
| Working Example 14 | 5.5 | 950 | blue |
| Working Example 15 | 5.3 | 850 | blue |
| Working Example 16 | 5.2 | 1000 | blue |
| Working Example 17 | 5.4 | 1000 | blue |
| Working Example 18 | 5.3 | 900 | blue |
| Working Example 19 | 5.4 | 950 | blue |
| Comparative Example 16 | 10.8 | 50 | green |
| Working Example 20 | 11.9 | 130 | green |
| Comparative Example 17 | 5.8 | 120 | red |
| Working Example 21 | 7.8 | 350 | red |
| Working Example 22 | 5.2 | 1100 | blue |
| Working Example 23 | 5.8 | 1100 | blue |
| Working Example 24 | 5.7 | 900 | blue |
| Comparative Example 18 | 5.0 | 20 | blue |
| Comparative Example 19 | 5.2 | 4 | blue |
| Comparative Example 20 | 5.1 | 180 | blue |
| Comparative Example 21 | 5.7 | 1 or less | blue |

DESCRIPTION OF SYMBOLS 2 substrate
3 anode
4 hole injection layer
5 first hole transport layer
6 second hole transport layer
7 light-emitting layer
8 electron transport layer
9 cathode
10 organic electroluminescent element (organic EL element)
11 organic layer
12 protective layer
14 adhesive layer
16 sealing container
20 light-emitting device
30 light scattering member
30A light incidence face
30B light emission face
31 transparent substrate
32 microparticles
40 lighting device

The invention claimed is:

1. An organic electroluminescent element having an anode, a hole injection layer, a first hole transport layer, a second hole transport layer, a light-emitting layer, and a cathode, in this order, wherein
this hole injection layer includes a material for which the energy of the lowest unoccupied molecular orbital (LUMO) is less than −4.0 eV, and the energy E1(LUMO) of the LUMO of the material included in said first hole transport layer and the energy E2(LUMO) of the LUMO of the material included in said second hole transport layer satisfy the inequality: E1(LUMO) >E2(LUMO).

2. The organic electroluminescent element according to claim 1, wherein said first hole transport layer includes at least one type of material expressed by any of General Formulas 1 to 3 below:

General Formula 1

M;

General Formula 2

M—(X—M)ₙ—X—M;

General Formula 3

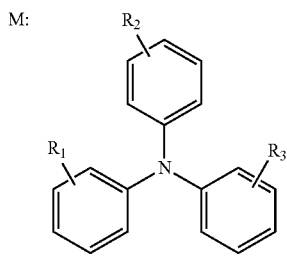

General Formula 4

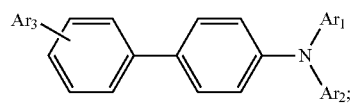

General Formula 5

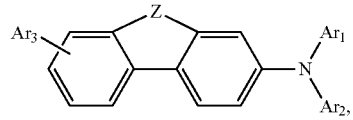

M represents the following structure, wherein if M is bonded to X, then M represents a structure in which hydrogen atoms have been removed from the benzene ring of the following structure in a number corresponding to the number of bonded X groups:

M:

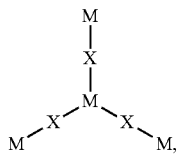

wherein: $R_1$, $R_2$, and $R_3$ each independently represents an alkyl group, a cycloalkyl group, a silyl group, an alkoxy group, an aryloxy group, an alkylthio group, or an arylthio group; $R_1$, $R_2$, and $R_3$ may each bond together to form a ring;

X groups each independently represents one of the following structures:

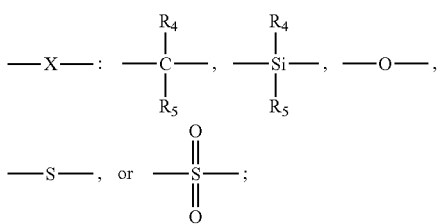

wherein: $R_4$ and $R_5$ each independently represents an alkyl group, a cycloalkyl group, a silyl group, an alkoxy group, an aryloxy group, an alkylthio group, or an arylthio group; $R_4$ and $R_5$ may bond together to form a ring; and n represents an integer greater than or equal to 0.

3. The organic electroluminescent element according to claim 1, wherein the energy E1(LUMO) of the LUMO of the material included in said first hole transport layer and the energy E2(LUMO) of the LUMO of the material included in said second hole transport layer satisfy [the inequality] E1(LUMO)>E2(LUMO)+0.3 eV.

4. The organic electroluminescent element according to claim 1, wherein said second hole transport layer includes at least one type of material expressed by either of General Formulas 4 and 5 below:

wherein: $Ar_1$ and $Ar_2$ represent each independently an aryl group; aryl groups $Ar_1$ and $Ar_2$ may be substituted with an alkyl group, an aryl group, or an amino group;

$Ar_3$ represents an amino group substituted with an alkyl group or an aryl group; the aryl group substituted on the amino group of $Ar_3$ may be further substituted with an alkyl group, an aryl group, or an amino group; and the alkyl group or aryl group substituted on the amino group of $Ar_3$ may form a ring by bonding to another alkyl group or aryl group substituted on the amino group of $Ar_3$;

Z represents one of the following structures:

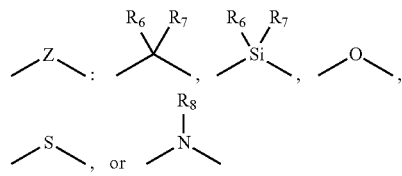

$R_6$ to $R_8$ represent each independently an alkyl group or an aryl group; and the aryl group of $R_6$ to $R_8$ may be substituted with an alkyl group, an aryl group, or an amino group.

5. The organic electroluminescent element according to claim 1, wherein the material which is included in said hole injection layer and for which the energy of the LUMO is less than −4.0 eV is a material expressed by General Formula A below:

Rpi–(CN)ⱼ    General Formula A wherein: Rpi indicates an organic group including four or more π electrons, and j indicates an integer from 1 to 8.

6. The organic electroluminescent element according to claim 1, wherein the thickness of said first hole transport layer is 3 to 30 nm.

7. The organic electroluminescent element according to claim 1, wherein the thickness of said second hole transport layer is 3 to 30 nm.

8. The organic electroluminescent element according to claim 1, further comprising an electron transport layer between said light-emitting layer and said cathode.

9. The organic electroluminescent element according to claim 1, wherein said light-emitting layer contains a light-emitting dopant and a host material, and said light-emitting dopant is a phosphorescent material.

10. The organic electroluminescent element according to claim 9, wherein said phosphorescent material is an iridium complex.

11. A light-emitting device featuring the organic electroluminescent element according to claim 1.

12. A display device featuring the organic electroluminescent element according to claim 1.

13. A lighting device featuring the organic electroluminescent element according to claim 1.

14. The electroluminescent element according to claim 1, wherein the material included in the hole injection layer is compound HI-1:

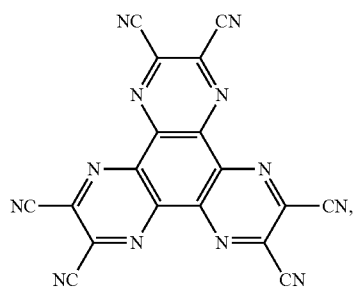 [SMILES: N#Cc1nc2c3nc(C#N)c(C#N)nc3c3nc(C#N)c(C#N)nc3c2nc1C#N]

the material included in said first hole transport layer is Compound A-1:

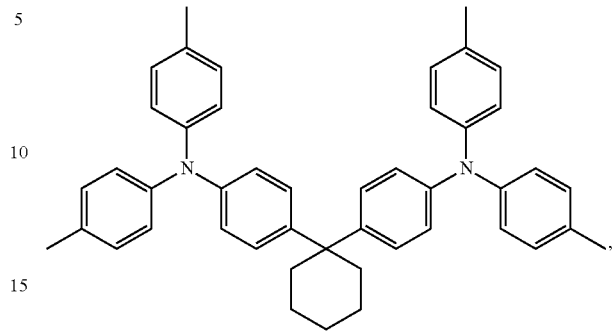

and the material included in said second hole transport layer is Compound B-4:

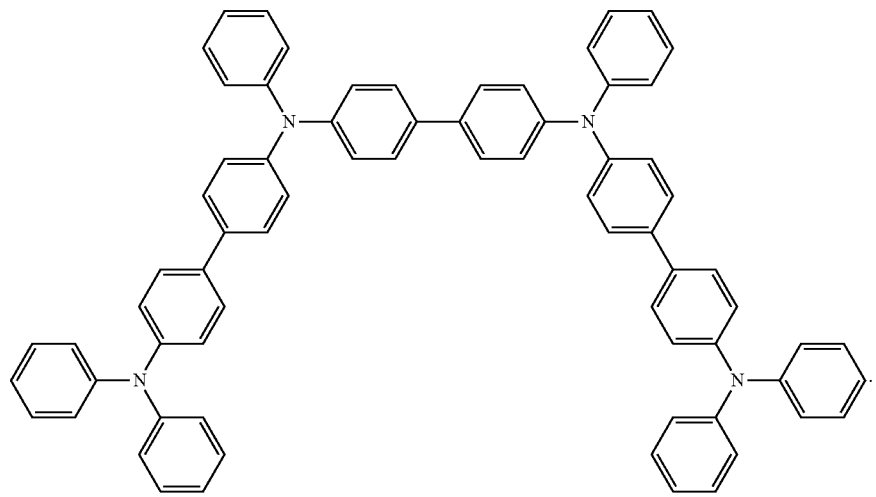 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

* * * * *